US006064222A

United States Patent [19]

Morita et al.

[11] Patent Number: 6,064,222

[45] Date of Patent: May 16, 2000

[54] LIQUID-CRYSTAL DISPLAY DEVICE HAVING CHECKOUT CIRCUIT

[75] Inventors: Keizo Morita; Munehiro Haraguchi; Koji Yoshioka; Masafumi Itokazu; Hiroshi Murakami, all of Kawasaki, Japan

[73] Assignee: Fujitsu Limited, Kawasaki, Japan

[21] Appl. No.: 08/910,657

[22] Filed: Aug. 13, 1997

[30] Foreign Application Priority Data

Mar. 19, 1997 [JP] Japan .................................... 9-066906

[51] Int. Cl.[7] ....................................................... G01R 31/00

[52] U.S. Cl. ........................................... 324/770; 324/73.1

[58] Field of Search ..................................... 324/770, 719, 324/537, 73.1; 349/192

[56] References Cited

U.S. PATENT DOCUMENTS 4,972,144 11/1990 Lyon et al. ......................... 324/73.1 X
5,113,134 5/1992 Plus et al. ............................... 324/770
5,754,158 5/1998 Misawa et al. ......................... 324/770

*Primary Examiner*—Glenn W. Brown
*Attorney, Agent, or Firm*—Greer, Burns & Crain, Ltd.

[57] ABSTRACT

A liquid-crystal display device includes a substrate with a pixel area including a plurality of scanning buses, a plurality of data buses intersecting therewith and pixel transistors and pixel electrodes formed at the intersections therebetween; a scanning driver for energizing these scanning buses; and a data driver for presenting these data buses with data signals. A checkout circuit equipped with a plurality of checkout transistors connected to the corresponding data buses or scanning buses; an input bus for applying prescribed checkout signals to the plurality of checkout transistors; and an output bus for picking up the signals from the plurality of checkout transistors.

12 Claims, 30 Drawing Sheets

LINE-SEQUENTIAL DRIVE SYSTEM

POINT-SEQUENTIAL DRIVE SYSTEM

LIQUID-CRYSTAL DISPLAY DEVICE HAVING CHECKOUT CIRCUIT

BACKGROUND OF THE INVENTION

1. Field of the Invention

The present invention relates to an integrated active-matrix liquid-crystal display device in which driver circuits and other peripheral circuits are formed on the same substrate as the pixel elements, and more particularly to a liquid-crystal display device equipped with a checkout circuit for detecting driver circuit malfunctions, break or short of data bus lines or scanning bus lines, and other failures.

2. Description of the Related Art

In an active-matrix-type liquid-crystal display device, each pixel electrode has a selection transistor, and scanning buses are energized to cause the selection transistor to conduct. A picture that corresponds to video signals is displayed by applying video signals on a data bus to pixel electrodes via the selection transistors. Thin-film transistors are therefore formed in matrix on glass and other transparent substrate surfaces.

It has been common in the past to use LSI circuits to separately form driver circuits for driving the aforementioned scanning buses or data buses and to mount the driver circuits on motherboards or the like. The modular boards of such driver circuits are connected by cables or the like to the bus lines on display substrates.

In recent years, however, it has been proposed to cut costs by forming not only the transistors of pixel areas but also driver circuits and other peripheral circuits on the same substrate. In such integrated active-matrix liquid-crystal display devices, peripheral circuits are composed of thin-film transistors in the same manner as the transistors of pixel elements. Costs are expected to be lowered by manufacturing the transistors of peripheral circuits together with the transistors of the pixel areas.

In the past, only those LSI circuits that had been found to have satisfactory quality as a result of an inspection process could be used in driver circuits and other peripheral circuits composed of individual LSI circuits. In an integrated display device, however, peripheral circuits are formed together with the pixel area on a transparent substrate, making it impossible to determine in advance whether these driver circuits or the like will operate properly.

In addition, a liquid-crystal display device is assembled by injecting liquid crystals between a panel in which a pixel electrode is formed and a panel in which a common electrode is formed. Faulty panels should therefore be removed as a result of an inspection process that precedes the assembly stage. If defects are discovered after a device has been completed, the entire finished product must be discarded, reducing the production yield and driving up overall costs.

An integrated active-matrix-type liquid-crystal display device has been proposed in recent years, but a technique for optimizing the performance check of integrally formed driver circuits has yet to be proposed.

SUMMARY OF THE INVENTION

In view of the foregoing, an object of the present invention is to provide a checkout circuit for checking peripheral circuits in an active-matrix-type liquid-crystal display device equipped with integrated driver circuits and other peripheral circuits.

Another object of the present invention is to provide an active-matrix-type liquid-crystal display device equipped with a checkout circuit capable of using integrated driver circuits to detect breaks or shorts in the data buses or scanning buses of the pixel area.

Aimed at attaining the stated objects, the present invention resides in a liquid-crystal display device obtained by providing a substrate with a pixel area including a plurality of scanning buses, a plurality of data buses intersecting therewith and pixel transistors and pixel electrodes formed at the intersections therebetween; with a scanning driver for energizing these scanning buses; and with a data driver for presenting these data buses with data signals; further comprising: a checkout circuit equipped with a plurality of checkout transistors connected to the corresponding data buses or scanning buses; with an input bus for applying prescribed checkout signals to the plurality of checkout transistors; and with an output bus for picking up the signals from the plurality of checkout transistors.

The data driver or scanning driver applies detection pulses to the data buses or scanning buses, making it possible to monitor the operating state of the driver or the presence of shorts or breaks in the data buses or scanning buses by making use of the resulting signals from the output bus that are sensed in accordance with the conduction state of the checkout transistors.

The present invention also resides in a liquid-crystal display device obtained by providing a substrate with a pixel area including a plurality of scanning buses, a plurality of data buses intersecting therewith and pixel transistors and pixel electrodes formed at the intersection therebetween; with a scanning driver for energizing these scanning buses; and with a data driver for presenting these data buses with data signals; wherein the data driver applies the data signals to the data buses in the form of a time series in synchronous with a prescribed clock pulse; and a checkout circuit in which a detection bus is commonly connected to the plurality of data buses is also provided.

The presence of the point sequential drive-type data driver described above allows the checkout circuit to perform checkout procedures.

DESCRIPTION OF THE PREFERRED EMBODIMENTS

Embodiments of the present invention will now be described with reference to drawings, but these embodiments do not limit the technological scope of the present invention.

Figure 1:
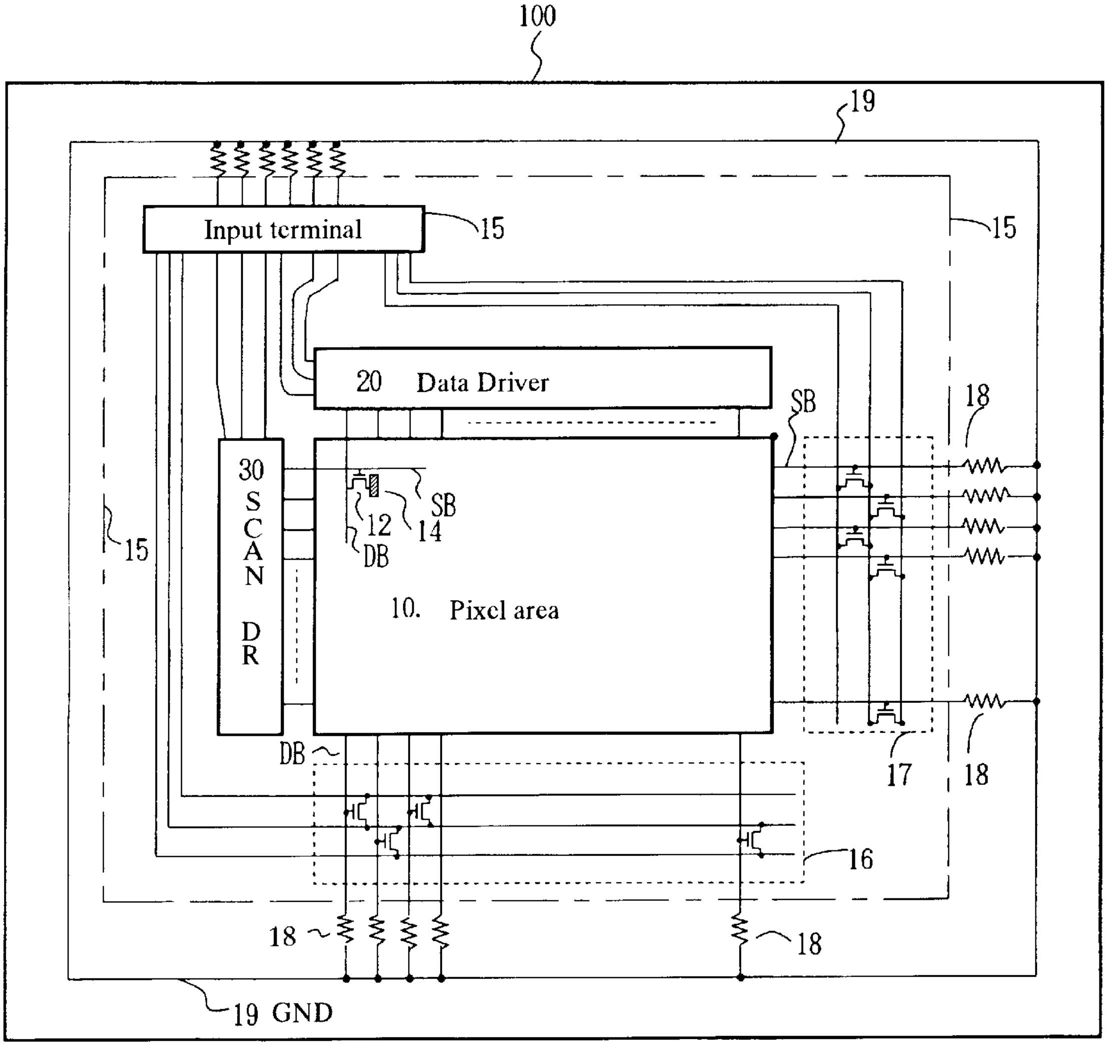
FIG. 1 is a structural drawing of a panel for an integrated active-matrix-type liquid-crystal display device according to an embodiment of the present invention.

FIG. 1 is a structural drawing of a panel for an integrated active-matrix-type liquid-crystal display device according to an embodiment of the present invention. In this embodiment, a pixel area 10 is formed integrally with a data driver 20 and a scanning driver 30 on glass or another transparent substrate 100. The pixel area 10 is equipped with a plurality of scanning buses SB in the horizontal direction and a plurality of data buses DB in the vertical direction, and the intersection point of each pixel is provided with a selection transistor 12 and a pixel electrode 14.

In this embodiment, the drivers 20 and 30 are provided with checkout circuits 16 and 17, respectively, on the opposite sides of the pixel area 10. The data buses DB and scanning buses SB are connected to a common terminal wiring 19 via terminal resistances 18. The terminal wiring is commonly maintained at ground potential, preventing the transistors within the driver circuit or pixel area 10 from being broken down by static electricity generated during assembly, checkout, and other steps. After the manufacturing and checking steps have been completed, the panel is cut off along the dashed line 15 in FIG. 1 and is used to form an assembly with another panel. In other words, the dashed line 15 is a scribe line.

FIG. 1 depicts an example in which the checkout circuits 16 and 17 are used. This example is described in detail below.

Before the checkout circuits are described, a brief description of the drive circuits will be given. As shown in FIG. 1, it is necessary to provide a scanning driver 30 for energizing the scanning buses SB and a data driver 20 for presenting the data buses DB with video signals. The scanning driver 30 generally energizes the scanning buses SB in synchronism with horizontal synchronous signals, for example, in sequence from the top down. As a result, the scanning driver 30 includes, for example, a shift register and an output drive circuit thereof. The data driver 20 may operate in accordance with a line-sequential drive system or a point-sequential drive system, depending on the circuit structure thereof.

Figure 2:
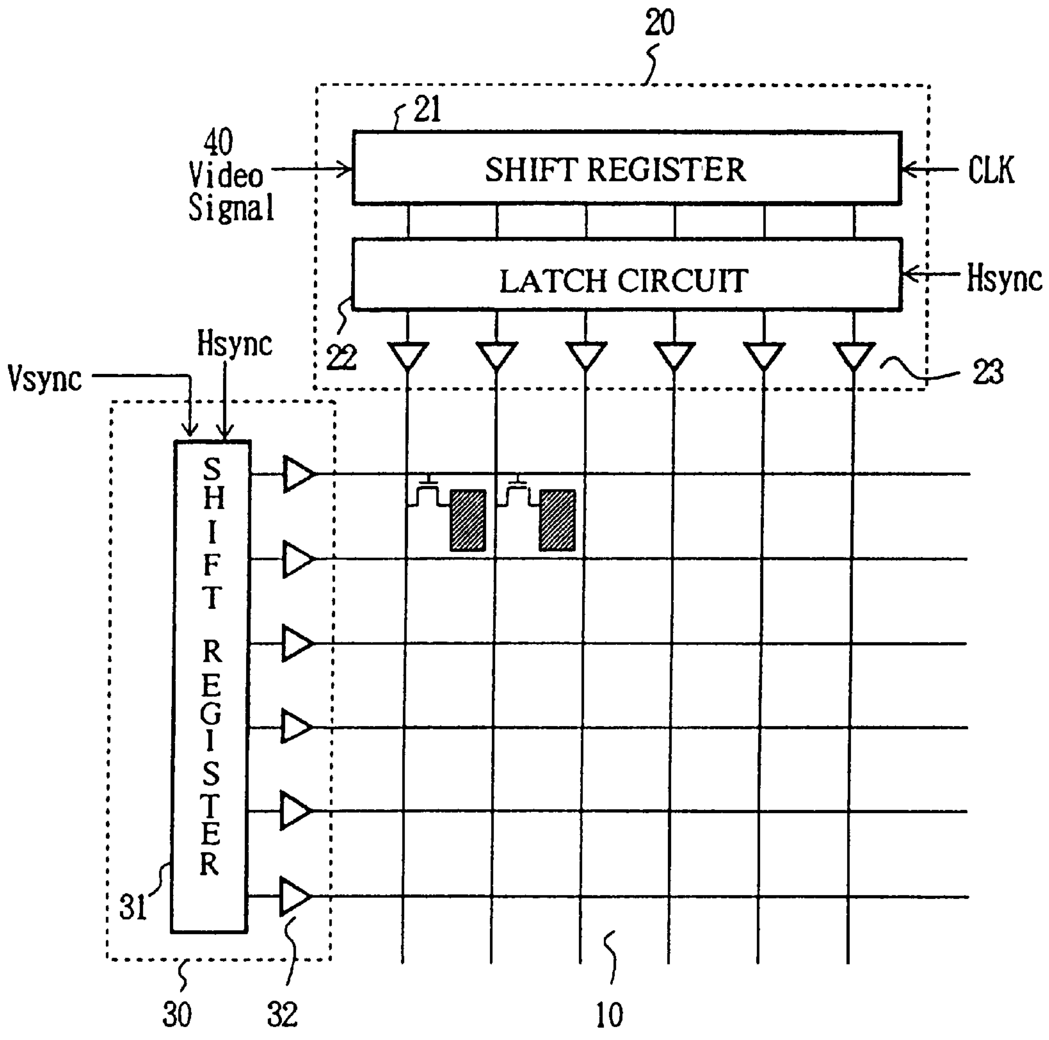
FIG. 2 is a circuit block diagram of a panel for a liquid-crystal display device in which the data driver operates in accordance with a line-sequential drive system.

FIG. 2 is a circuit block diagram of a panel for a liquid-crystal display device in which the data driver operates in accordance with the line-sequential drive system described above. In the line-sequential drive system, video signals 40 for one scan line are latched, and all the data buses DB are energized based on the latched video signals in synchronism with a horizontal synchronous signal Hsync. The data driver 20 therefore accommodates a shift register 21 for the serial/parallel conversion of the video signal 40, a latching circuit 22 for latching therein the outputs of this shift register 21 and drive circuits 23 for energizing the data buses DB in accordance with the signals retained by the latching circuit 22.

Meanwhile, the scanning driver 30 is provided with a shift register 31 that is set by a vertical synchronous signal Vsync and that performs shifting operations on the basis of the horizontal synchronous signal Hsync, and with a drive circuit 32 for sequentially energizing the scanning buses SB in accordance with the output from the shift register 31.

With such a line-sequential drive system, it is necessary to detect malfunctions in the circuits of the data driver 20 and the scanning driver 30. In addition, prescribed checkout pulses can be applied to the data buses DB and scanning buses SB by employing these drivers. Using these functions makes it possible to detect breaks or shorts in the data buses or scanning buses, as described below.

Figure 3:
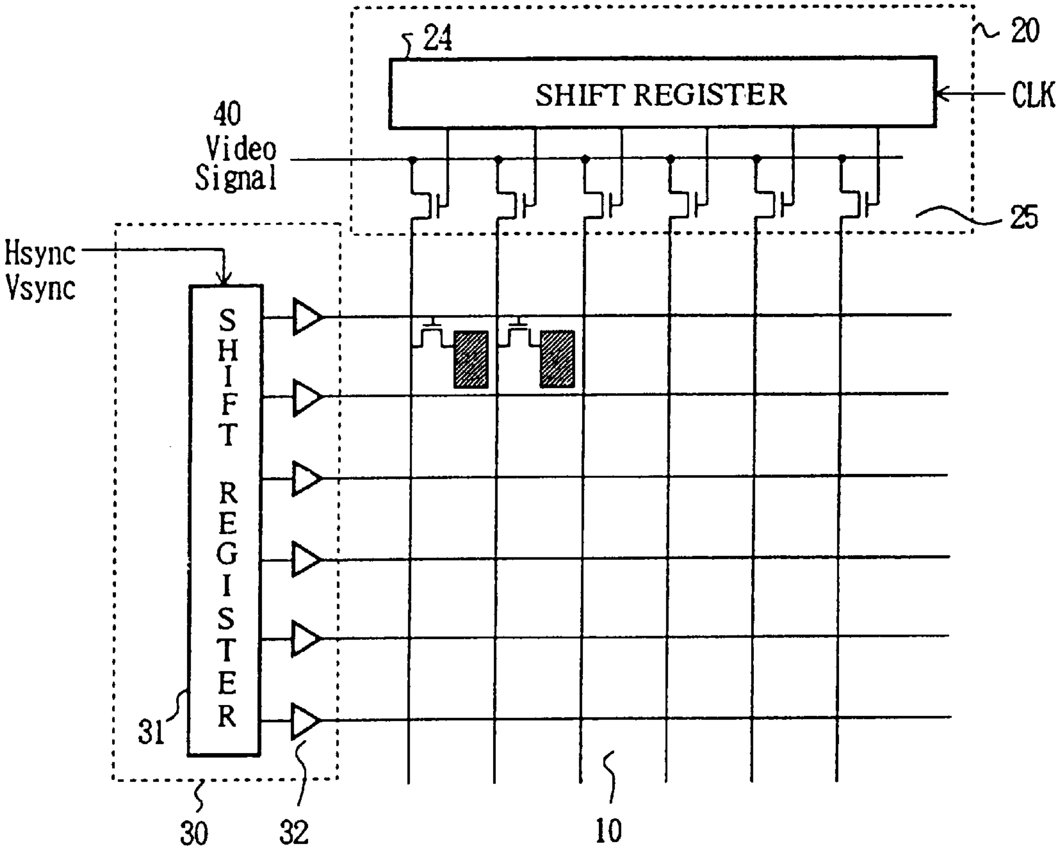
FIG. 3 is a circuit block diagram of a panel for a liquid-crystal display device in which the data driver operates in accordance with a point-sequential drive system.

FIG. 3 is a circuit block diagram of a panel for a liquid-crystal display device in which the data driver operates in accordance with a point-sequential drive system. In the point-sequential drive system, the latching circuit of the line-sequential drive system can be dispensed with due to the fact that the serially inputted video signal 40 is applied unchanged to the data buses DB. This system is suitable for use in cases in which the simplest possible integrated circuits of the thin-film transistors formed on the surface of a glass substrate are used to minimize their cost.

As shown in FIG. 3, the only components provided to the data driver 20 are a shift register 24 for performing shifting operations on the basis of a clock signal CLK and analog switches 25 for applying the video signal 40 to each data bus DB. The resulting structure is therefore simpler than that of the data driver in FIG. 2. The scanning driver 30 is the same as in the arrangement shown in FIG. 2. Thus, it is difficult to apply arbitrary checkout clocks on the side of the data buses DB in the data driver operating in accordance with the point-sequential drive system.

Pulse signals having an arbitrary pattern can thus be applied to the scanning buses or data buses in the scanning driver 30 and the line-sequential drive-type data driver 20, making it possible to construct a checkout circuit in which this function is utilized. By contrast, a point sequential drive-type data driver does not have such a function, and a checkout circuit complying with the data driver must therefore be provided. In view of this, the checkout circuit pertaining to the embodiment of the present invention will now be described separately with reference to a case in which the checkout circuit can be used for the scanning driver 30 and the line-sequential drive-type data driver 20, and to a case in which the checkout circuit can be used for a point sequential drive-type data driver.

Figure 4:
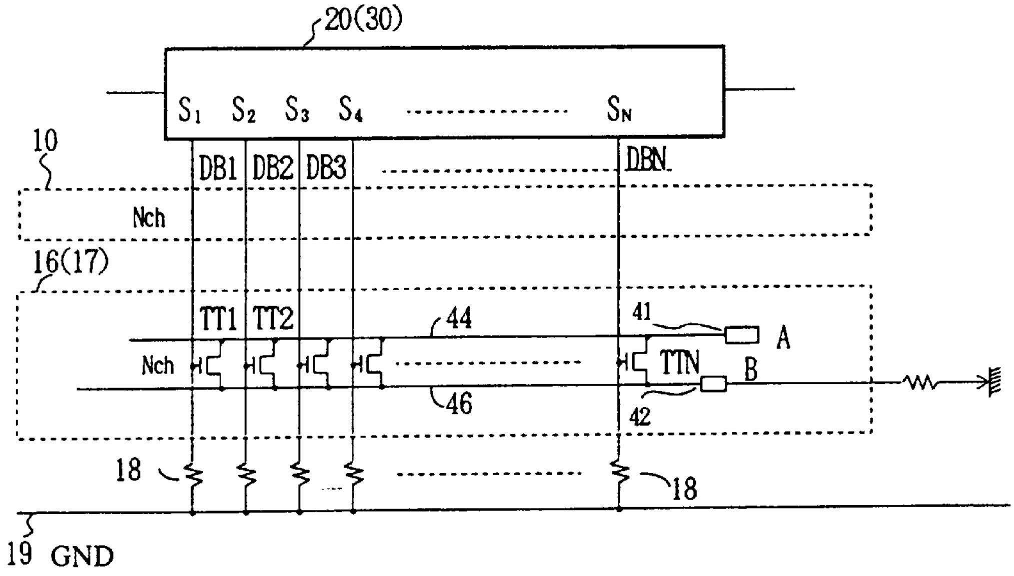
FIG. 4 is a circuit diagram depicting a checkout circuit applicable to a line-sequential drive-type data driver 20 and scanning driver 30.

Checkout Circuit Applicable to Scanning Driver and Point Sequential Drive-type Data Driver FIG. 4 is a circuit diagram depicting a checkout circuit applicable to a line-sequential drive-type data driver 20 and a scanning driver 30. Although this checkout circuit can be applied to either driver, a case in which the circuit is applied to the data driver will be described for the sake of simplicity.

The checkout circuit 16 comprises, for example, N-type MOS transistors TT1 through TTN whose gates are connected to data buses DB1 through DBN, respectively. These checkout transistors TT1 through TTN are also connected to an input bus 44, itself connected to a checkout signal input terminal 41 (A), and to an output bus 46, itself connected to a checkout signal output terminal 42 (B). The checkout signal input terminal 41 and the output terminal 42 both have signal pads that can be contacted from the outside. Alternatively they may be connected to the internal circuits on the panel, as will be described below.

In the checkout circuit 16, for example, high-level pulse signals are sequentially applied from the data driver 20 to the data buses DB through output terminals, making it possible to determine, first, whether the data driver 20 operates normally and, second, whether there is a break in the data bus DB, depending on whether or not the checkout signal output terminal 42 can reproduce a voltage level that has been applied to the checkout signal input terminal 41 in accordance with the corresponding timing.

Figure 5:
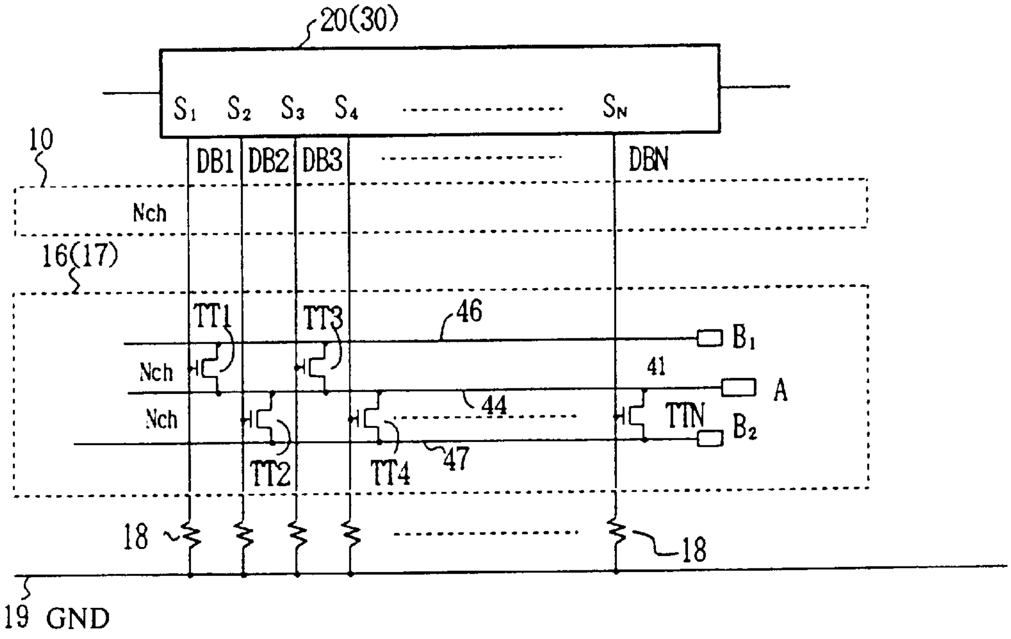
FIG. 5 is a diagram of another checkout circuit.

FIG. 5 is a diagram of the checkout circuit 16 of FIG. 4 to which further improvements have been added. In this checkout circuit 16, odd-numbered transistors from among the checkout transistors TT1 through TTN are disposed between the input checkout bus 44 and the output checkout bus 46, and even-numbered checkout transistors are disposed between the input checkout bus 44 and an output checkout bus 47. Checkout signal output terminals B1 and B2 are provided to the output buses 46 and 47, respectively. Such a structure allows shorts between adjacent data buses DB to be detected together with malfunctions in the aforementioned data driver 20 or breaks in the data buses DB.

Figure 6:
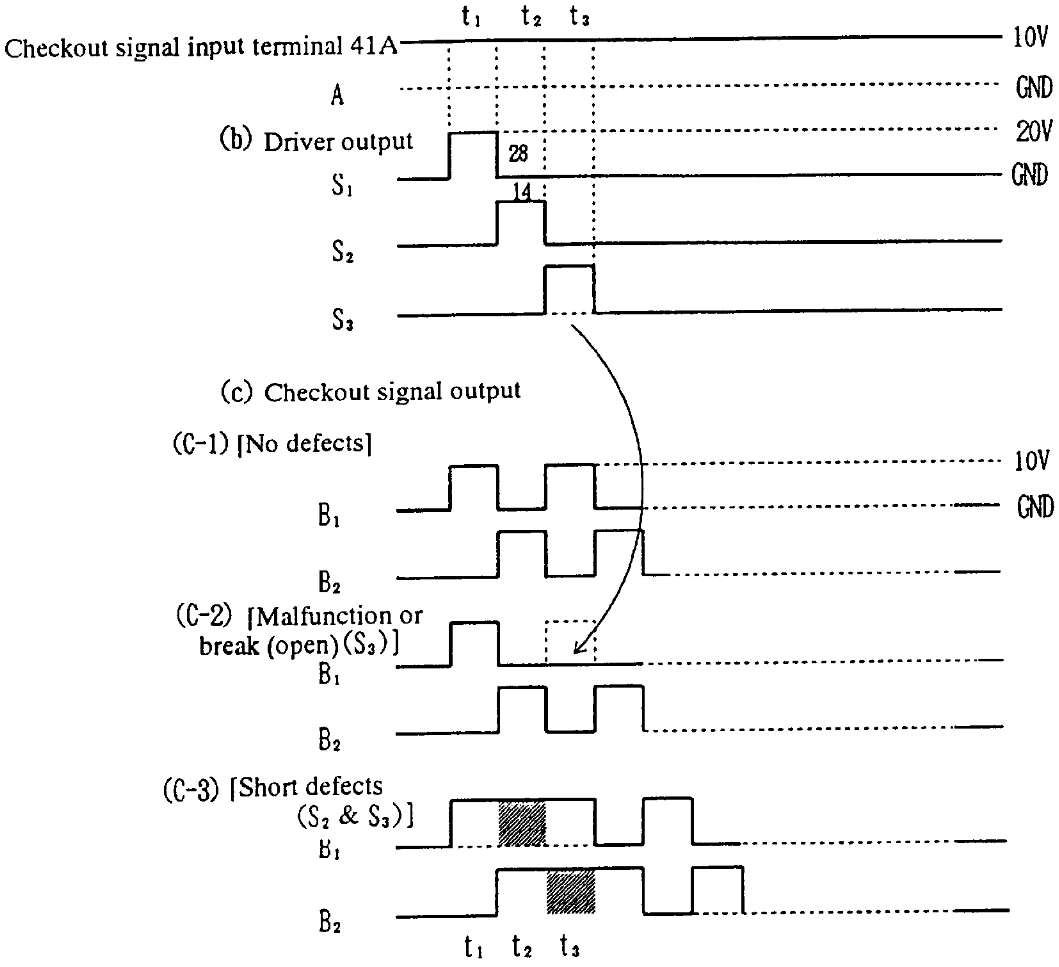
FIG. 6 is a timing chart illustrating checkout procedures conducted using the checkout circuit in FIG. 5.

FIG. 6 is a timing chart illustrating the checkout procedures conducted using the checkout circuit 16 in FIG. 5. Section (a) of FIG. 6 depicts a checkout signal (for example, a fixed voltage of 10 V) applied to the checkout signal input terminal 41A. Section (b) of FIG. 6 depicts the output waveform of the driver 20. Here, the outputs S1, S2, and S3 reach the H-level at times t1, t2, and t3, respectively. Specifically, the driver 20 sequentially energizes the data buses DB to the H-level. Here, the H-level is, for example, a voltage of 20 V. Section (c) of FIG. 6 depicts the checkout signal outputs picked up at this time at the checkout signal output terminals B1 and B2. The following cases are depicted: a case in which there are no defects (c-1), a case in which a malfunction has occurred or there is a break in a data bus DB3 (c-2), and a case in which there is a short between the data buses DB2 and DB3 (c-3).

The checkout transistors TT1 through TTN are successively rendered conductive by the H-level applied to the outputs S1, S2, and S3 of the driver 20. The checkout signal output depicted in (c-1) of FIG. 6, which illustrates a defect-free case, will be obtained if no defects are detected at the checkout signal output terminal B1 or B2. Because the driver output S is set at 20 V, the checkout signal output will be the same (10 V) as the checkout signal.

Next, the output S3 of the driver 20 fails to produce a signal (for example, an H-level signal) if a malfunction is detected in the driver 20, as shown in (c-2) FIG. 6. Or, if there is a break (open circuit) in the data bus DB3, the data bus DB3 will be maintained at ground level of the terminal wiring system 19 by the terminal resistance 18 even when an H-level signal is applied to the output S3 of the driver 20. Consequently, the H-level signal will not be picked up at the checkout signal output terminal B1 in accordance with the timing of time t3, as shown in (c-2) FIG. 6.

Furthermore, the presence of a short between the data buses DB2 and DB3 causes the H-level signals at the outputs S2 and S3 of the driver 20 to be applied to both the data bus DB2 and the data bus DB3, leading to the detection of the H-level signals at the checkout signal output terminals B1 and B2 at times t2 and t3, as shown in (c-3) FIG. 6. It is therefore possible to determine the location of a short between the data buses by connecting the checkout transistors connected to the odd-numbered data buses and even-numbered data buses to mutually different output buses 46 and 47.

Figure 7:
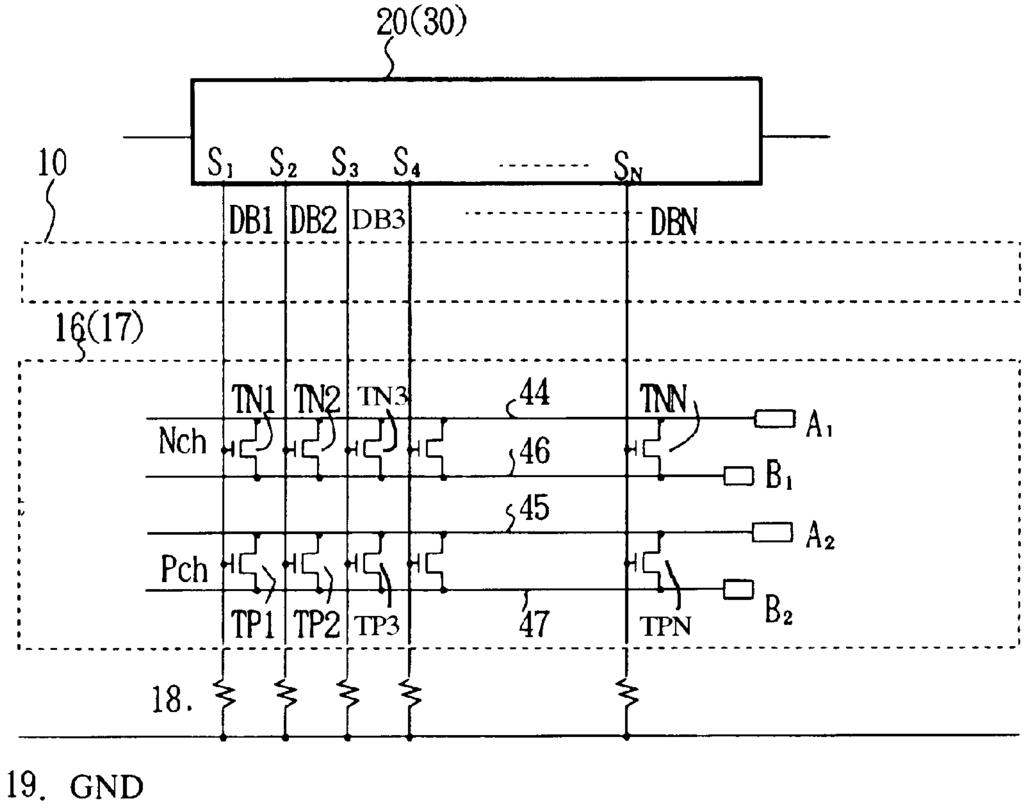
FIG. 7 is a diagram depicting yet another checkout circuit.

FIG. 7 is a diagram depicting yet another checkout circuit 16. In this checkout circuit, the checkout transistors comprise N-channel-type transistors TN1 through TNT and P-channel-type transistors TP1 through TPN. These transistors are connected between an input bus 44, itself connected to a checkout signal input terminal A1, and an output bus 46, itself connected to an output terminal B1, and between an input bus 45, itself connected to a checkout signal input terminal A2, and an output bus 47, itself connected to an output terminal B2.

Figure 8:
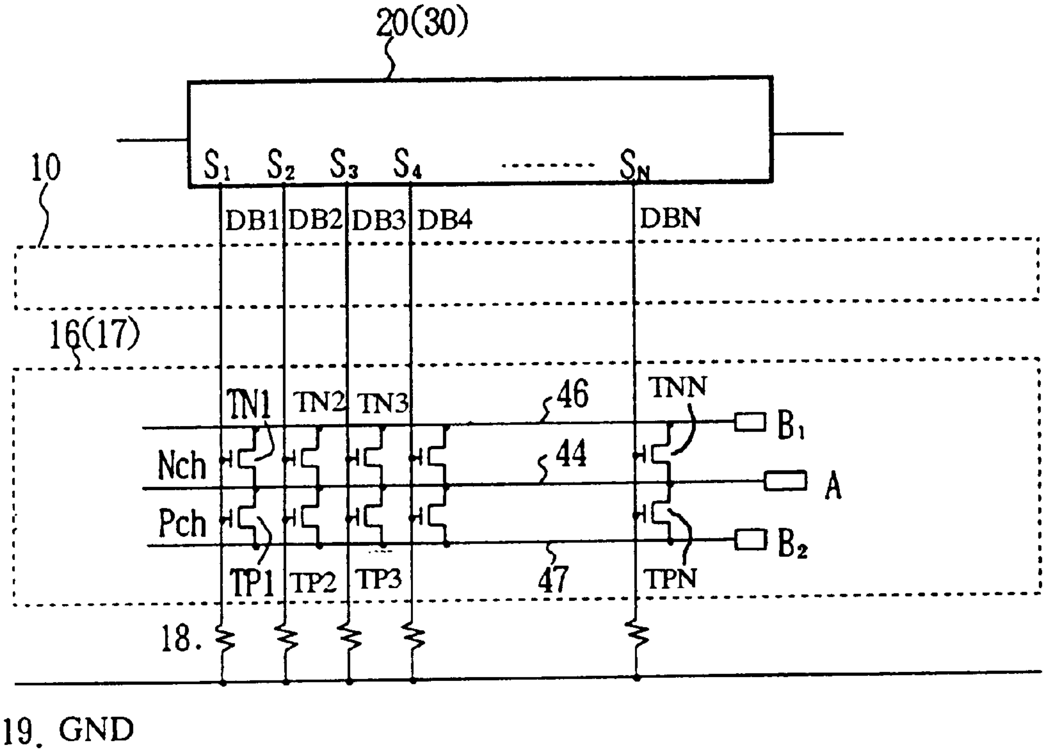
FIG. 8 is a diagram depicting a modified checkout circuit of FIG. 7.

FIG. 8 depicts an improved checkout circuit of FIG. 7 provided with a common checkout signal input terminal A and a common input bus 44. The rest of the assembly has the same structure.

The checkout circuits shown in FIGS. 7 and 8 are provided with different conduction-type checkout transistors, making it possible to detect the malfunctions of the driver 20 while distinguishing between the defects in which the output is set at an H-level and the defects in which the output is set at an L-level. It is necessary to sequentially apply H-level pulse signals and L-level pulse signals from the driver 20 to the data buses DB.

Figure 9:
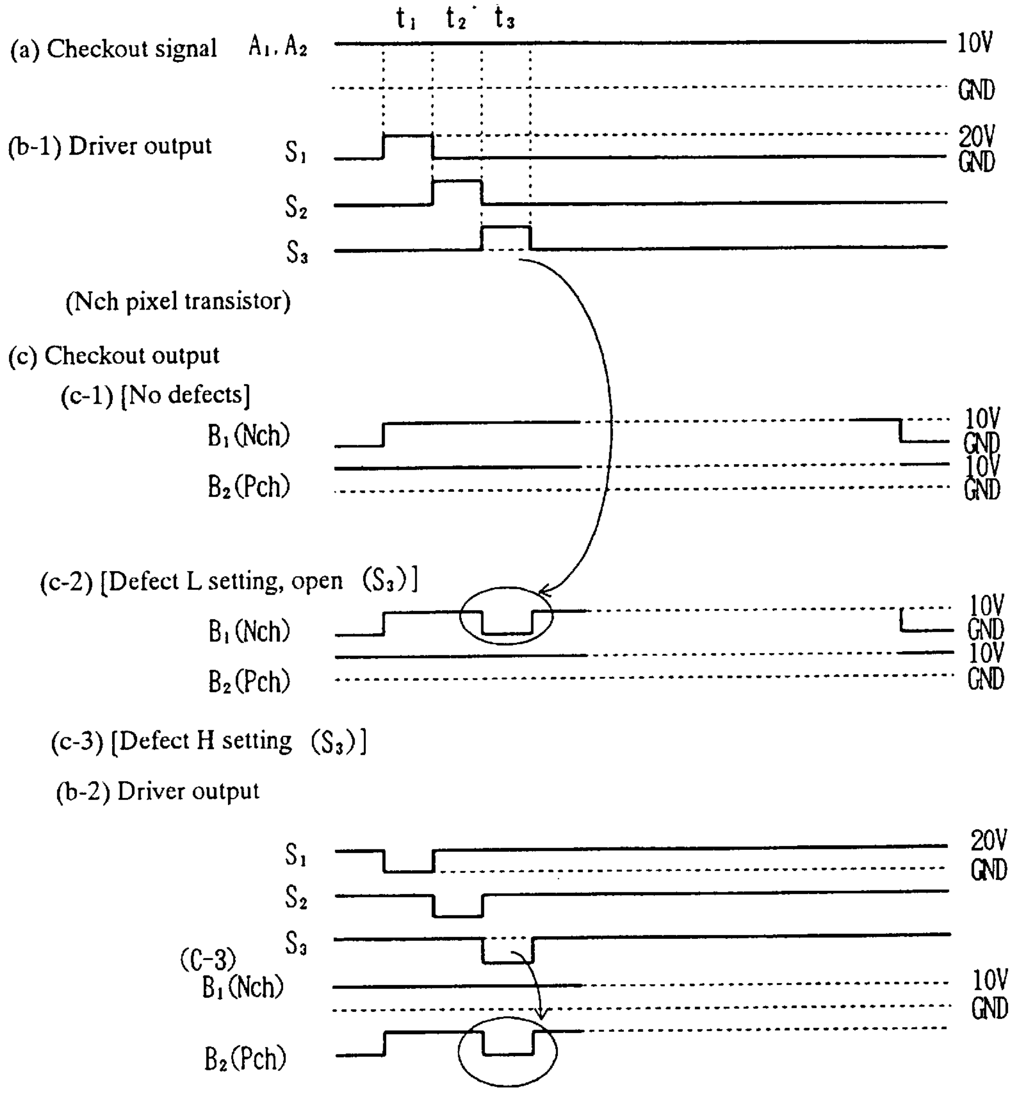
FIG. 9 is a timing chart illustrating the operation of the checkout circuits in FIGS. 8 and 9.
Figure 10:
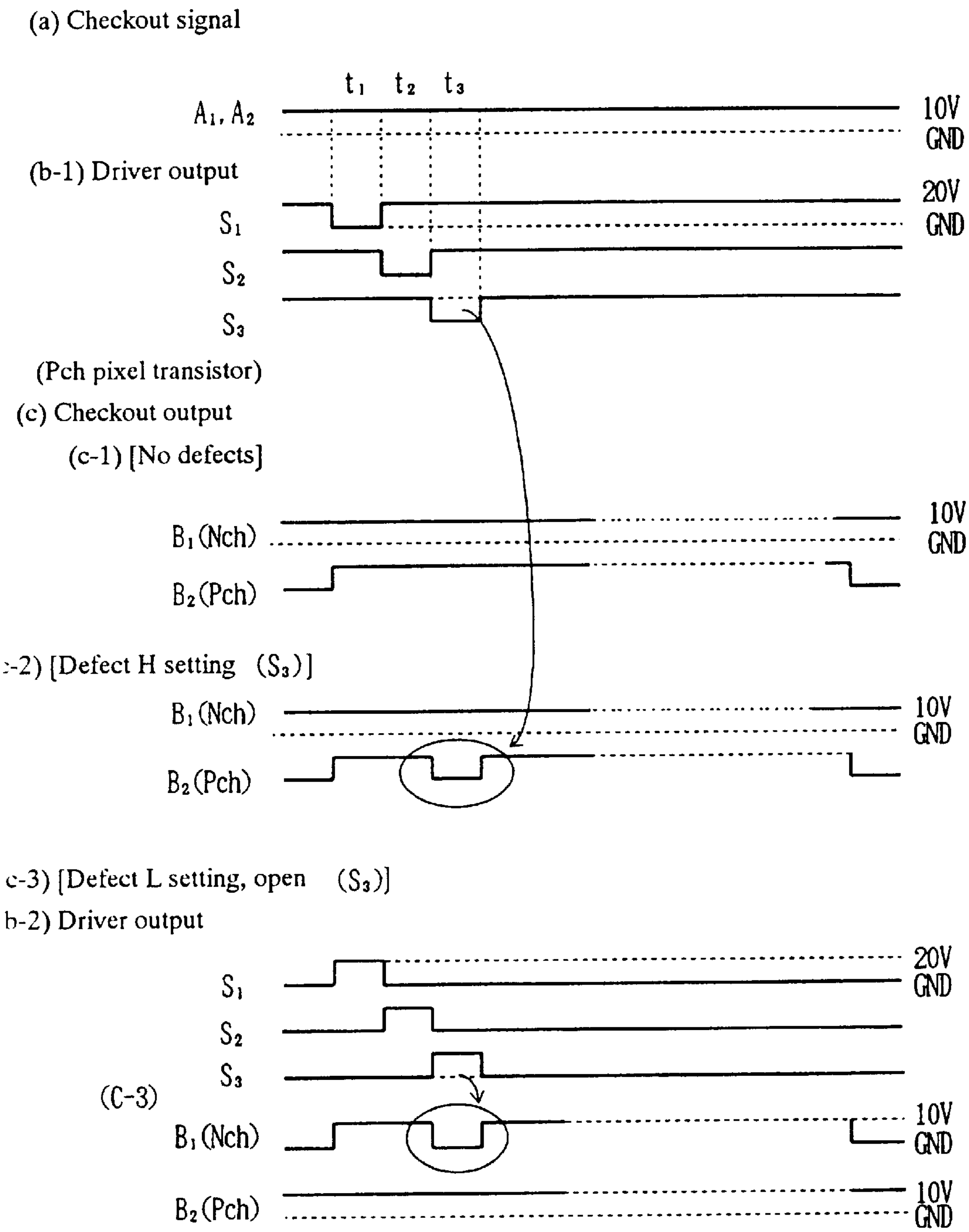
FIG. 10 is a timing chart illustrating the operation of the checkout circuits in FIGS. 8 and 9.

FIGS. 9 and 10 are timing charts illustrating the operation of the checkout circuits in FIGS. 7 and 8. As described above, H-level pulse signals and L-level pulse signals are sequentially applied from the driver 20 to the data buses DB in order to distinguish between faulty H-level output settings and faulty L-level output settings of the driver 20, whereby an L-level setting is detected when the N-type checkout transistors are in the non-conductive state, and an H-level setting is detected when the P-type checkout transistors are in the non-conductive state.

FIG. 9 depicts a case in which the driver is used as a scanning driver 30, assuming that the selection transistors of the pixel area 10 are N-channel transistors. Specifically, the scanning driver 30 sequentially applies H-level pulse signals to the scanning buses SB when the selection transistors of the pixel area are N-type. Consequently, when the checkout circuit checks the scanning driver for malfunctions, it is desired that the scanning driver 30 has a function of generating L-level pulse signals in addition to the regular function of generating H-level pulse signals. When the driver is a data driver 20, adopting a line-sequential drive system allows pulse signals used for checkout to be generated by applying the data shown in (b-1) of FIG. 9.

A checkout signal (for example, 10 V) such as that shown in FIG. 9*a* is applied to the checkout signal output terminals A1 and A2. As shown in (b-1) of FIG. 9, the outputs S1, S2, and S3 of the driver sequentially generate H-level pulse signals (for example, 20 V) by performing a regular drive function. As shown in (c-1) of FIG. 9 the signals indicated are picked up at the output terminals B1 and B2 when there are no defects. Specifically, a voltage (for example, a voltage of 10 V) is picked up at the output terminal B1 by the conducting state of the N-channel checkout transistors TN1 through TNN. In addition, a voltage of 10 V is detected in a similar manner at the output terminal B2 when the P-channel checkout transistors TP1 through TPN are rendered conductive by the L-level of the outputs S1 through SN.

Next, the bus DB3 does not reach the H-level, and the N-type checkout transistor TN3 fails to become conductive when the driver 20 cannot deliver an H-level to the output S3 (faulty L-setting) or when the bus DB3 has a wire break. Consequently, the L-level is detected at time t3, as shown by B1 in (c-2) of FIG. 9. This feature is the same as in the case shown in FIG. 6.

In addition, the driver 20 generates H-level pulse signals (shown in (b-2) FIG. 9) at the output S3 when it cannot generate an L-level output (faulty H-setting). A voltage of 10 V is picked up at the output terminal B2 because a P-type checkout transistor is rendered conductive by the fact that outputs S1 and S2 of the driver 20 are at the L-level. The checkout transistor TP3 is nonconductive, however, when the driver 20 cannot produce an L-level pulse signal at the output S3 at time t3, and the waveform shown in (c-3) of FIG. 9 is picked up at the output terminal B2. This arrangement makes it possible to detect a faulty H-level setting of the driver 20.

FIG. 10 depicts a case in which the driver is used as a scanning driver 30, assuming that the selection transistors of the pixel area 10 are P-channel transistors. Specifically, the scanning driver 30 sequentially applies L-level pulse signals to scanning buses when the selection transistors of the pixel area are of the P-type. Consequently, when the checkout circuit checks the scanning driver for malfunctions, a function of generating H-level pulse signals should be added to the regular function of generating L-level pulse signals to the scanning driver 30.

Sequentially applying the L-level pulse signals shown in (b-1) of FIG. 10 to the outputs S1, S2, and S3 makes it possible to detect a faulty H-setting at the output terminal B2 by utilizing the conductive/non-conductive state of the P-type checkout transistors, as shown in (c-2) of FIG. 9.

Furthermore, for a defect in which the output of the scanning driver 30 acquires an L-setting to be detected, a function of sequentially generating H-level pulse signals should be added to the regular functions of the scanning driver 30. A line-sequential drive-type driver 20 has these functions, as described above. In addition, the driver as shown in (b-2) of FIG. 9 generates an H-level pulse-signal output, allowing faulty L-settings to be picked up at the output terminal B1 by the use of the conductive/non-conductive state of the N-type checkout transistors TN1 through TNN, as shown in (c-3) of FIG. 9.

Figure 11:
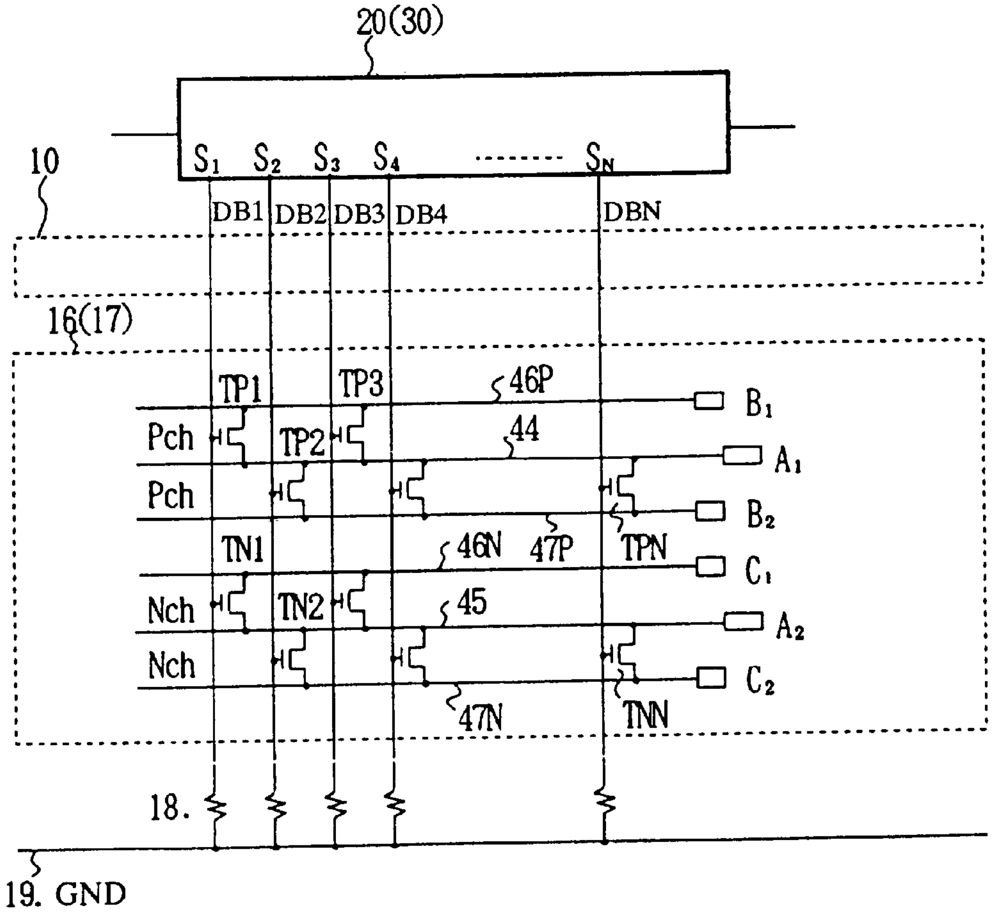
FIG. 11 is a diagram depicting still another checkout circuit to which further improvements have been added.

FIG. 11 is a diagram depicting still another checkout circuit, obtained by implementing additional improvements. Drive malfunctions can be detected, as can the presence of shorts or breaks in buses DB. In FIG. 5, the checkout transistors connected to odd-number bus DB and the checkout transistors connected to even-numbered buses DB are connected to different checkout output buses. As a result, shorts between the buses DB can be detected. In addition, faulty H- and L-settings of the drivers can be detected by providing the N- and P-type checkout transistors in FIGS. 7 and 8. The checkout circuit shown in FIG. 11 combines both these features. Specifically, it comprises both N- and P-type checkout transistors and utilizes different output buses for the transistors connected to the odd and even buses DB.

As shown in FIG. 11, P-type checkout transistors TP1 through TPN are connected to an input bus 44, itself connected to a checkout signal input terminal A1, and are also connected to an output bus 46P or 47P in accordance with odd and even numbers. Checkout signal output terminals B1 and B2 are connected to the output buses 46P and 47P, respectively.

Similarly, N-type checkout transistors TN1 through TNN are connected to an input bus 45, itself connected to a checkout signal input terminal A2, and are also connected to an output bus 46N or 47N in accordance with odd and even numbers. Checkout signal output terminals C1 and C2 are connected to the output buses 46N and 47N, respectively.

Figure 12:
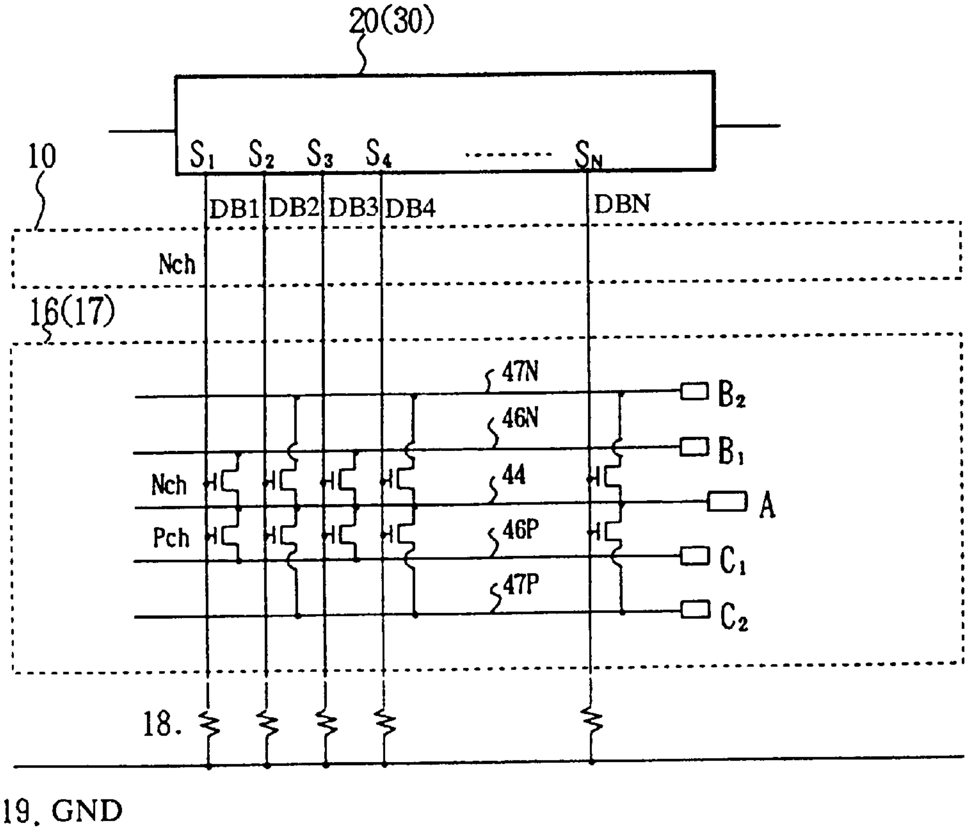
FIG. 12 is a diagram depicting the same checkout circuit as in FIG. 11.

FIG. 12 is a diagram of the same checkout circuit as in FIG. 11. In this checkout circuit 16, the P-type checkout transistors and the N-type checkout transistors have a common input bus 44, and a checkout signal input terminal A is connected to this bus 44. The rest of the structure is the same as in FIG. 11.

Figure 13:
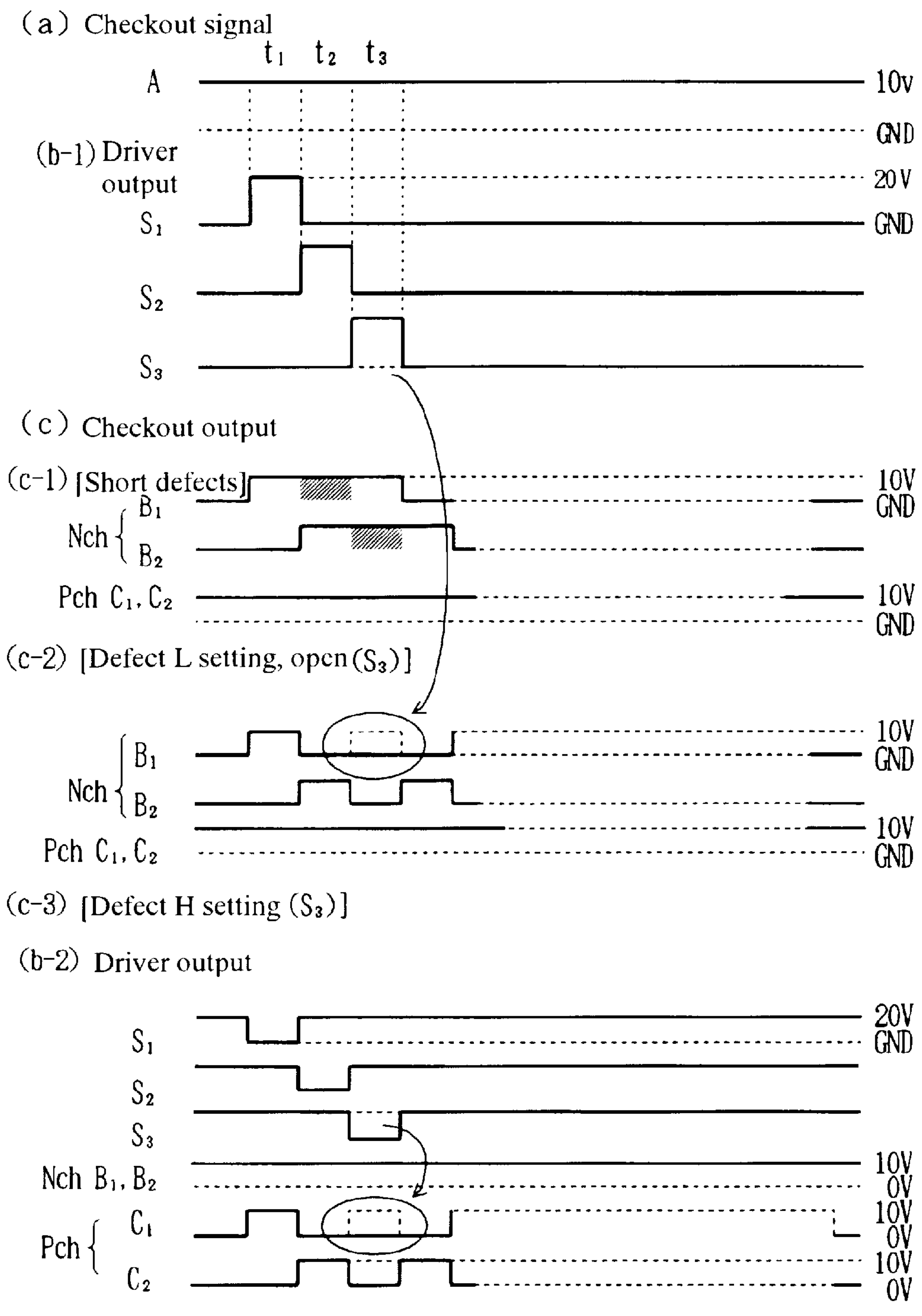
FIG. 13 is a timing chart illustrating the operation of the checkout circuits in FIGS. 11 and 12.

FIG. 13 is a timing chart illustrating the operation of the checkout circuits in FIGS. 11 and 12. Shorts or breaks (open circuits) can be detected in the buses DB, as can faulty H- or L-settings in the driver, by applying checkout signals to the input terminal A and outputting the same H- or L-level pulse signal from the driver 20 in the same manner as previously described with reference to FIGS. 6, 9, and 10.

The driver 20 generates the H-level pulse signal as in (b-1) of FIG. 13, making it possible to detect the existence of a short in the buses DB on the basis of the signals picked up at the outputs B1 and B2 of the N-type checkout transistors, as shown in (c-1) of FIG. 13. Specifically, the existence of a short between the buses DB2 and DB3 can be detected if both the output B1 and the output B2 acquire an H-level of 10 V at times t2 and t3. Similarly, the existence of a faulty L-level setting in the driver 20 or the existence of a break in the buses DB can be detected on the basis of the outputs B1 and B2, as shown in (c-2) of FIG. 13. In the example illustrated, a break or a faulty L-level setting of the bus DB3 can be detected at time t3 without an H-level pulse signal being picked up at the output B1.

Another feature is that, as shown in (c-3) of FIG. 13, a faulty H-level setting of the driver 20 can be detected based on the signals picked up at the outputs C1 and C2 of P-type checkout transistors as a result of the fact that the driver 20 generates the L-level pulse signal shown in (b-2) of FIG. 13. Although this is not shown in the drawings, the presence of a short in the buses DB can also be detected with the aid of the P-type checkout transistors.

Figure 14:
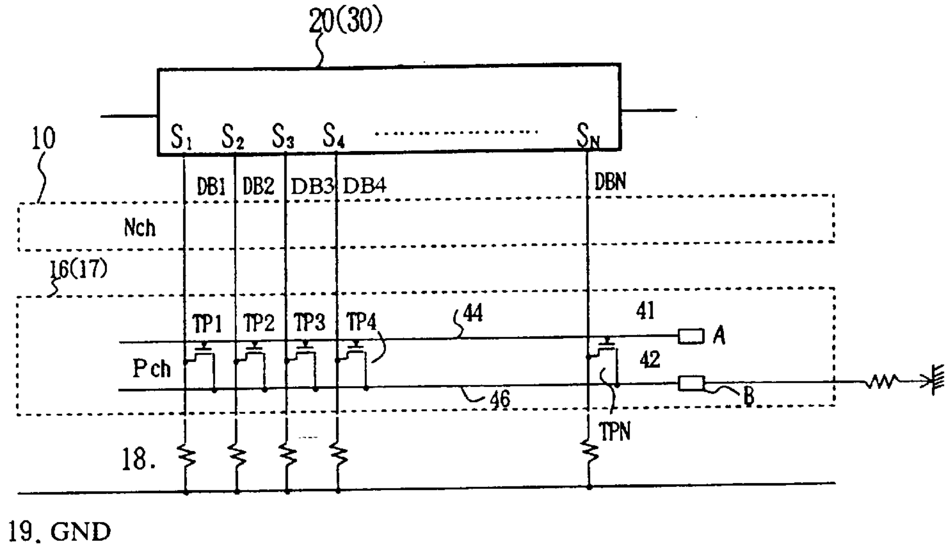
FIG. 14 is a diagram depicting the checkout circuit of a second embodiment.

FIG. 14 is a diagram depicting the checkout circuit of a second embodiment. Similar to the first embodiment described above, this checkout circuit is used for a scanning driver 30 or a line-sequential drive-type data driver 20.

In the checkout circuit of this embodiment, the connection of the checkout transistors differs from that in the first embodiment. Specifically, this embodiment entails using P-channel-type MOS transistors TP as checkout transistors, but their gates are connected to input buses 44, their source terminals to data buses DB, and their drains to output buses 46. With this arrangement, a checkout signal having a high voltage of about 10 V is applied from the checkout signal input terminal 41, and an H-level pulse signal greater than the checkout signal (for example, about 20 V) is applied to the outputs S1 through SN of the driver 20. As a result, the P-type transistors TP are rendered conductive in normal state, and the output signal (20 V) of the driver can be picked up at the checkout signal output terminal 42 connected to the drain. This operation is similar to that of the checkout circuit in FIG. 4.

Figure 15:
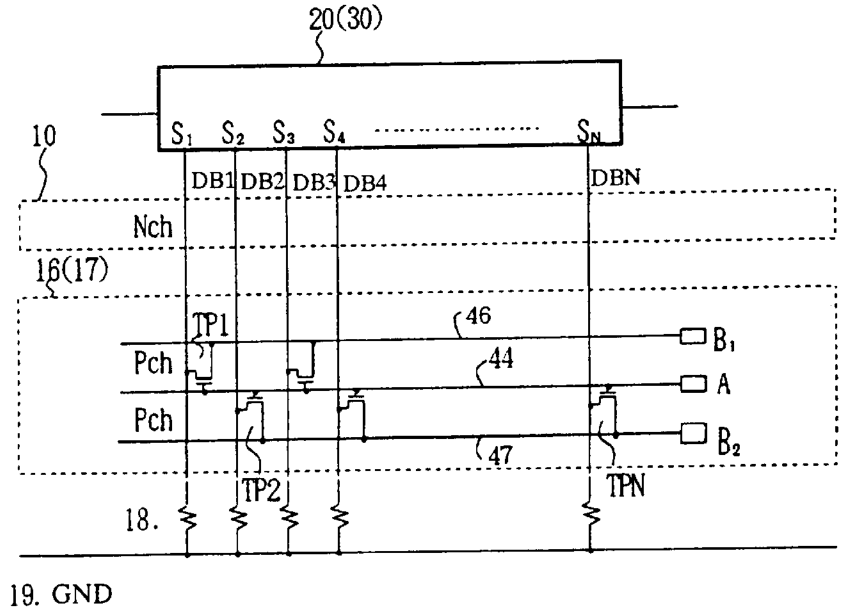
FIG. 15 is a diagram depicting the checkout circuit of FIG. 14 to which further improvements have been added.

FIG. 15 is a diagram depicting the checkout circuit of FIG. 14 to which further improvements have been added. In this checkout circuit, the outputs of the checkout transistors are connected to two different output buses 46 and 47, depending on whether the transistors are designed for use with odd or even buses DB, to make it possible to detect the presence of shorts between the buses DB. The structure is therefore the same as in FIG. 5.

Figure 16:
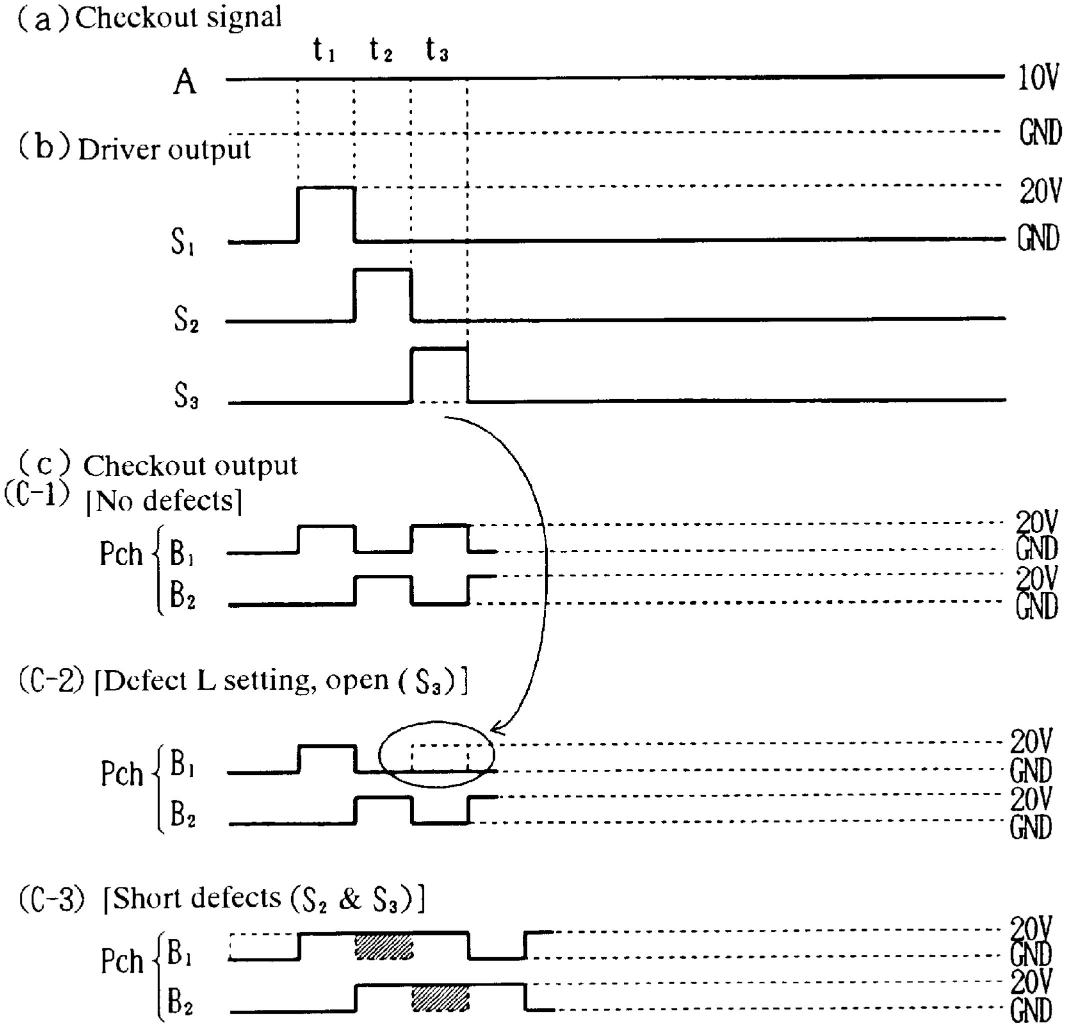
FIG. 16 is a timing chart illustrating the operation of the checkout circuit in FIG. 15.

FIG. 16 is a timing chart illustrating the operation of the check out circuit in FIG. 15. FIG. 16 is the same as FIG. 6. Specifically, as shown in (a) of FIG. 16, a checkout signal of about 10 V is applied to the checkout signal input terminal A. The driver 20 generates an H-level pulse signal of 20 V at the outputs S, as shown in (b) of FIG. 16. At this time, the following conditions are detected depending on the signals picked up at the checkout signal output terminals B1 and B2: the normal state (c-1), a faulty L-level setting of the driver or a break (open circuit) in the data buses DB (c-2), and a short between the buses DB (c-3).

In the normal state, the 20-V voltage of a driver output S is picked up at the output terminals B1 and B2, and such voltage is not detected in case of faulty L-setting or the like as shown in (c-2). In the case of a short, the signal shown in (c-3) of the drawing is picked up.

P-type checkout transistors are used for the checkout circuit in FIG. 15, but because the connection state is different from that in FIG. 5, the presence of the aforementioned defect is detected by the generation of an H-level pulse signal in the driver 20. It is therefore possible to render checkout transistors conductive by generating an L-level pulse signal in the driver 20 when N-type checkout transistors are connected in the same manner.

Figure 17:
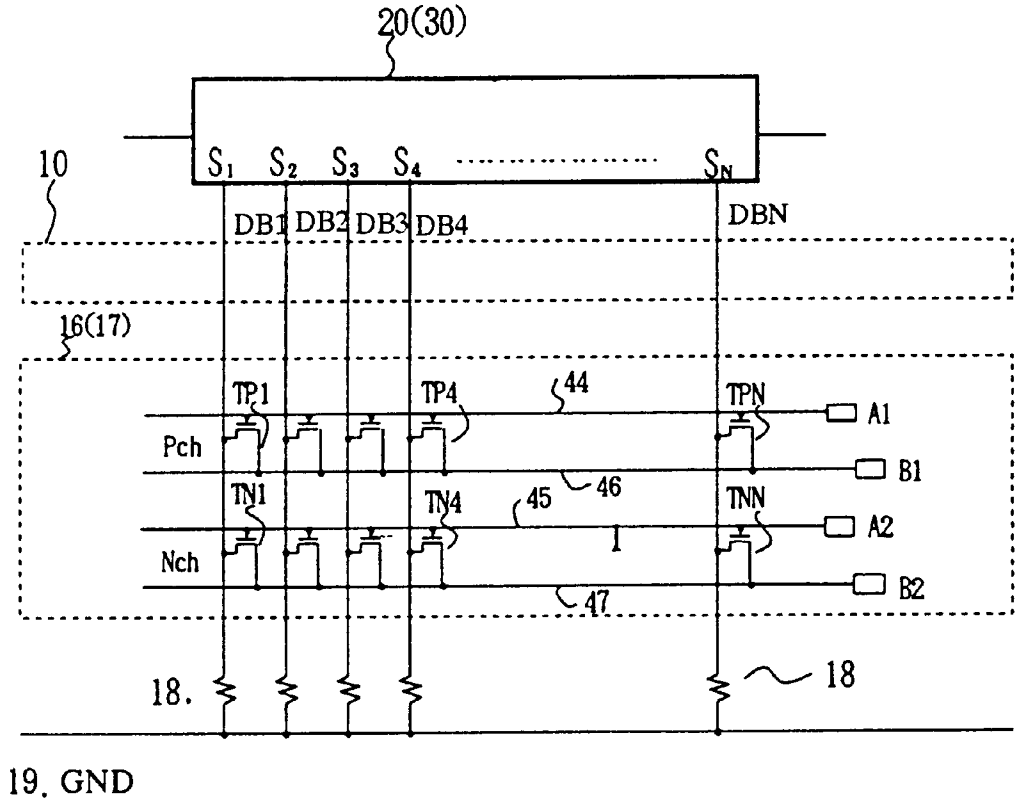
FIG. 17 is a diagram of another checkout circuit.
Figure 18:
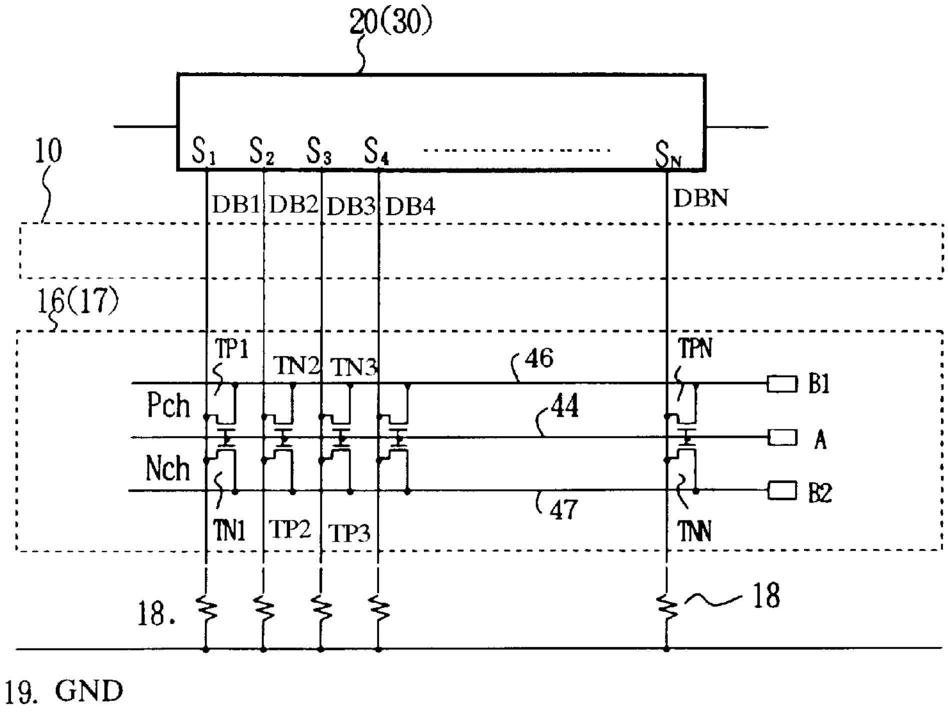
FIG. 18 is a diagram of the checkout circuit of FIG. 17 to which improvements have been added.

FIG. 17 is a diagram of another checkout circuit. FIG. 17 depicts a checkout circuit equipped with P-type and N-type checkout transistors. In addition, FIG. 18 is a diagram of the checkout circuit of FIG. 17 to which improvements have been added. This improved embodiment involves using a common input terminal A and a common input bus 44. Just as in the arrangements depicted in FIGS. 7 and 8, both a faulty L-level setting and a faulty H-level setting can be detected for the driver 20 by providing P-type and N-type checkout transistors. In this case, the driver 20 must be provided with a function of generating H-level pulse signals and a function of generating L-level pulse signals. This feature is the same as in the case described with reference to FIGS. 7 and 8. The mode of operation is therefore the same, and its description will be omitted.

Figure 19:
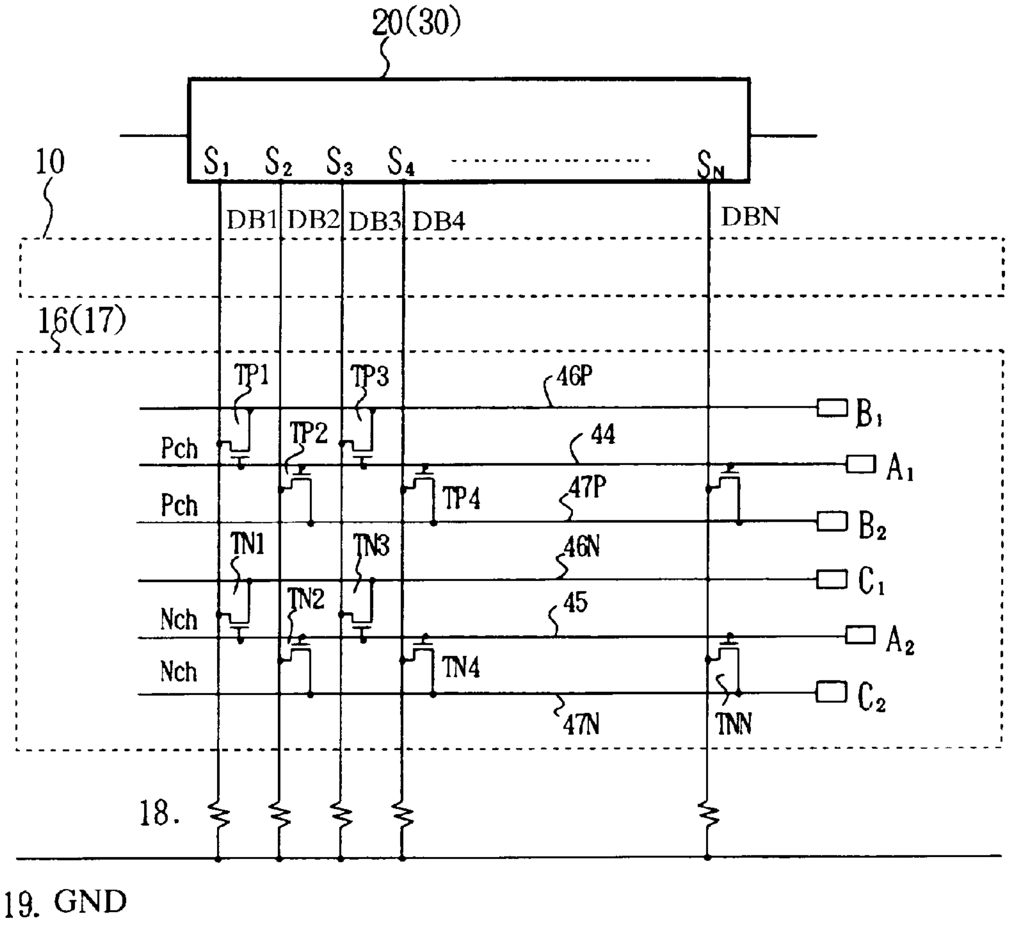
FIG. 19 is a diagram of yet another checkout circuit.

FIG. 19 is a diagram of yet another checkout circuit. This checkout circuit corresponds to FIG. 10. In addition, FIG. 20, which is a diagram of a checkout circuit obtained by improving the checkout circuit in FIG. 19, corresponds to FIG. 11. These checkout circuits comprise P-type and N-type checkout transistors TP and TN, and their connection with output buses B1, B2, C1, C2 differs for the transistors corresponding to odd-numbered buses DB and even-numbered buses DB. It is therefore possible to detect the presence of faulty H-level settings and faulty L-level settings in the driver 20, as well as the presence of breaks or shorts in the buses DB.

Figure 20:
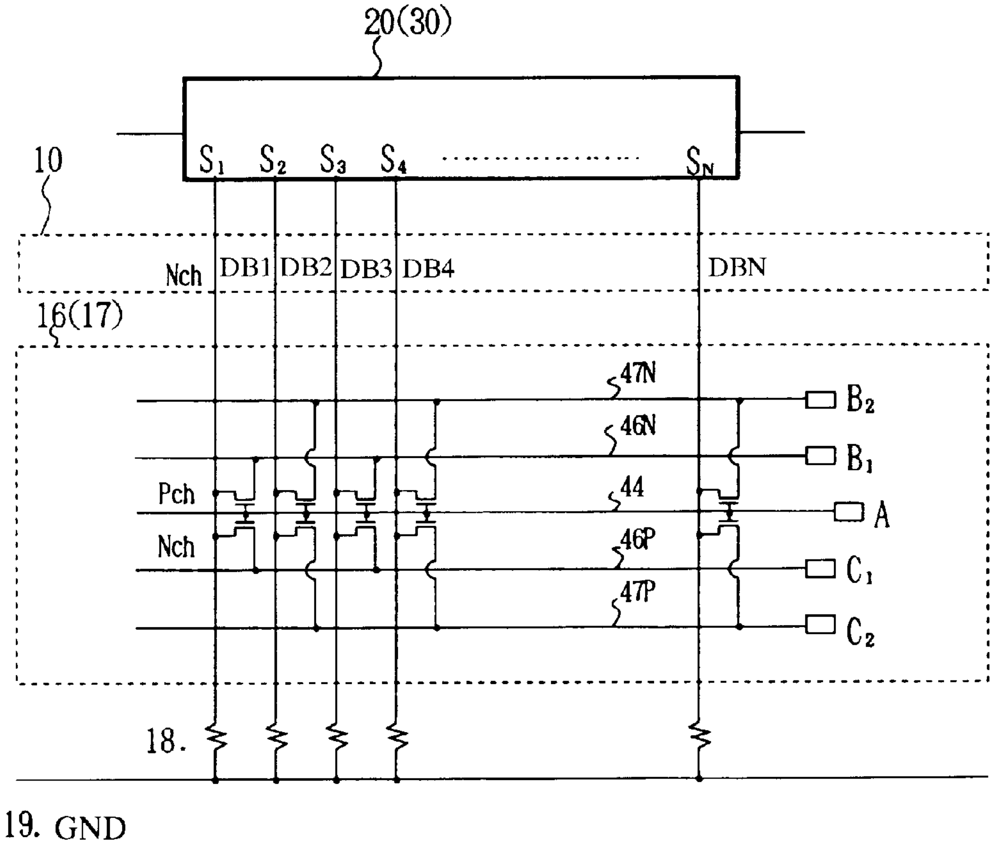
FIG. 20 is a diagram of the checkout circuit of FIG. 19 to which improvements have been added.
Figure 21:
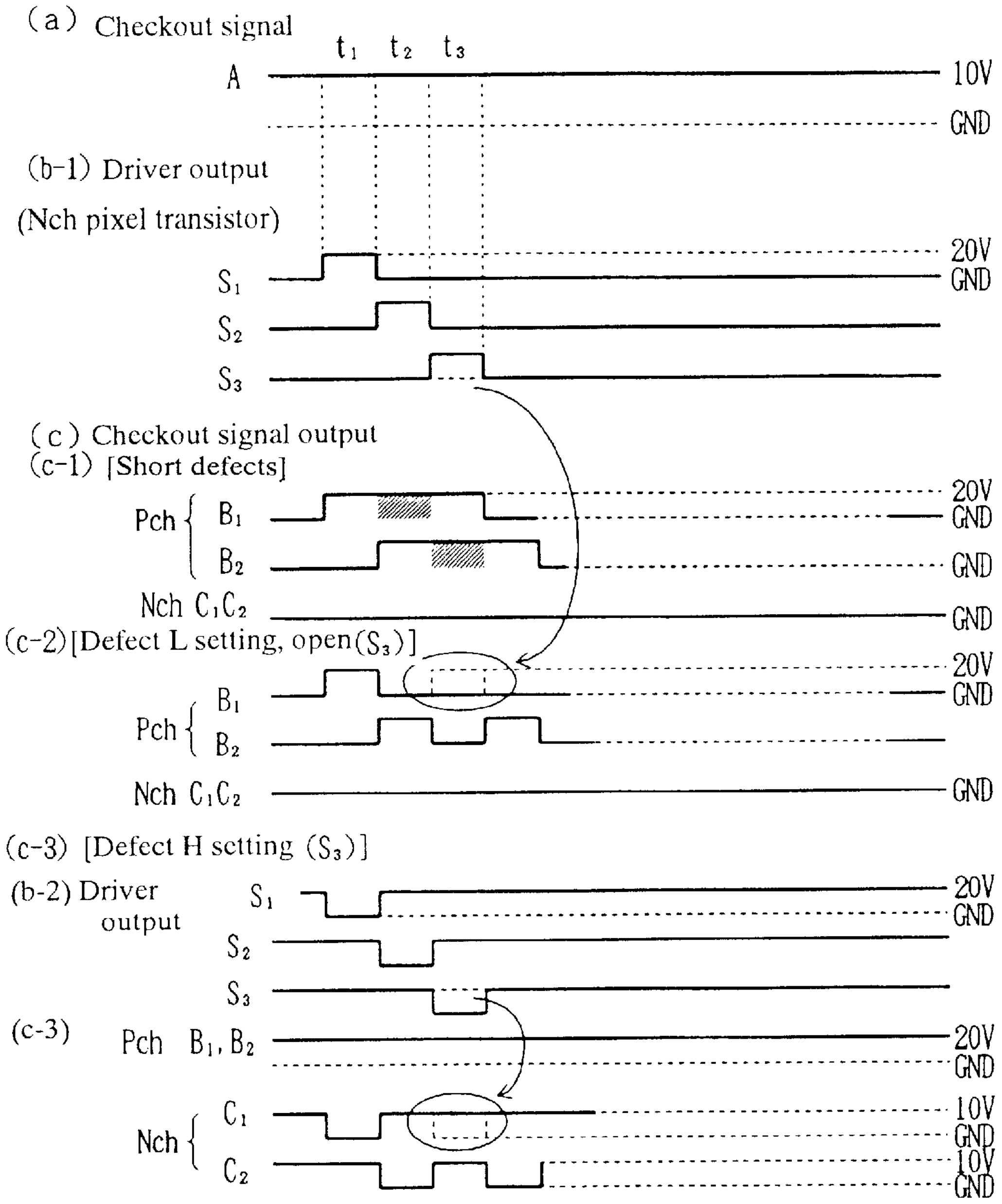
FIG. 21 is a timing chart illustrating the operation of the checkout circuits in FIGS. 19 and 20.

FIG. 21 is a timing chart illustrating the operation of the checkout circuits in FIGS. 19 and 20. This drawing is similar to FIG. 13, which illustrates the operation of the checkout circuits in FIGS. 11 and 12. Checkout signals, which have a voltage of 10 V, are applied to the checkout signal input terminal A. The H-level pulse signals (for example, 20 V) shown in (b-1) FIG. 21 are generated by the driver 20, whereby the presence of shorts between the buses DB2 and DB3 is detected based on the H-level (20 V) both of the output terminals B1 and B2 at times t2 and t3, as shown in (c-1) of FIG. 21. The presence of a break in the bus DB3 or the presence of a faulty L-level setting at the output S3 of the driver 20 is also detected based on the L-level at the output terminal B1 at time t3, as shown in (c-2) of FIG. 21.

The driver 20 is caused to generate L-level pulse signals such as those shown in (b-2) of FIG. 21, making it possible to detect the presence of a faulty H-level setting in the driver 20 on the basis of the L-level picked up at the output terminal C1 at time t3 as shown in (c-3) of FIG. 21. The result is that in this case as well, the driver 20 must be provided with a function aimed at generating H-and L-level pulse signals. Using the N-type transistors shown in FIGS. 19 and 20 entails, in terms of transistor characteristics, picking up a voltage that is lower by its threshold value than the 10-V data signals applied to the gates so it is detected at the checkout output terminals C1 and C2.

Figure 22:
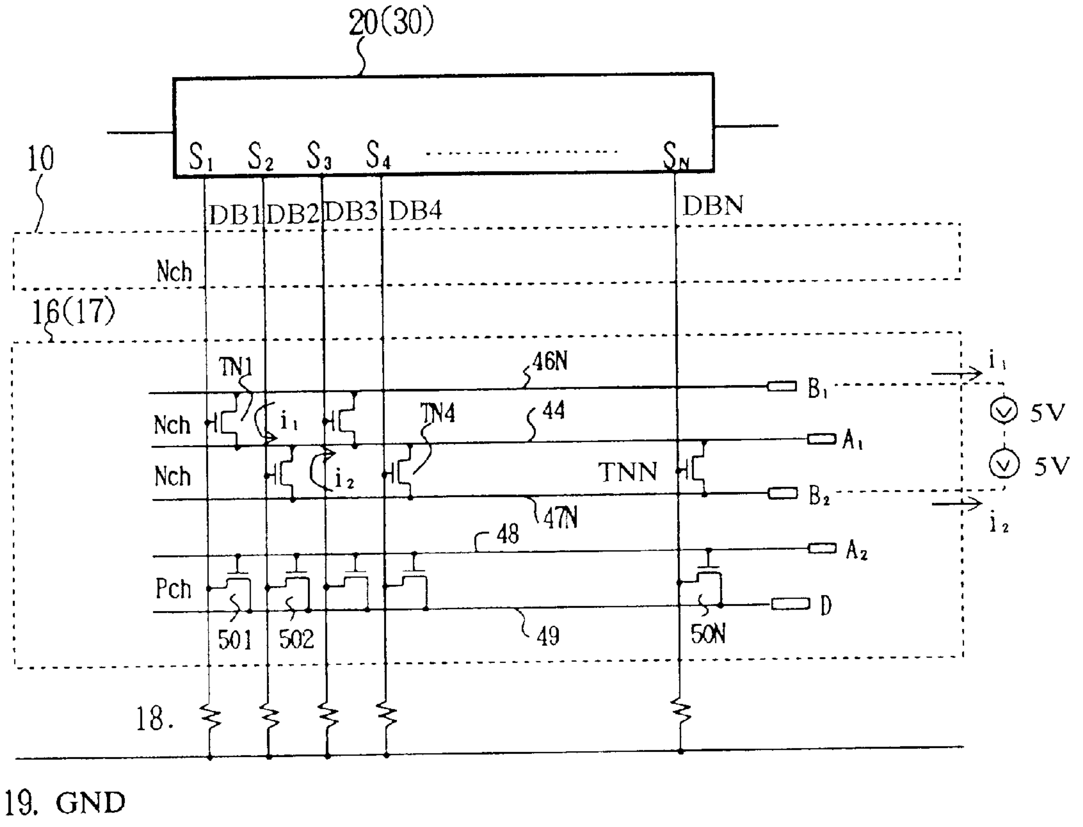
FIG. 22 is a diagram depicting the checkout circuit of a third embodiment.

FIG. 22 is a diagram depicting the checkout circuit of a third embodiment. In this checkout circuit, N-type checkout transistors TN1 through TNN are provided between the input bus 44 and the output buses 46N and 47N respectively. In this case, the checkout transistors corresponding to the odd-numbered buses DB and the even-numbered buses DB are connected to the output buses 46N and 47N. In addition, P-type checkout transistors 501 through 50N are connected in such a way that their gates are connected to an input bus 48, their sources to the buses DB, and their drains to an output bus 49.

The currents i1 and i2 flowing between the checkout signal input terminal A1 and the output terminals B1 and B2 are picked up at the output terminals B1 and B2. In addition, the value of the voltage applied to the buses DB can be picked up at an output terminal D by applying a prescribed voltage to the input terminal A2.

Specifically, a high voltage of, for example, 10 V is applied to the output S of the driver 20. The potential difference between the checkout signal input terminal A1 and the checkout signal output terminal B1 or B2 is set at 5 V, and both terminals are caused to increase from 0 V and 5 V. The currents i1 and i2 of the output terminals B1 and B2 are measured during the increase. At the same time, a voltage of, for example, 20 V is applied to the checkout signal input terminal A2, and this process is accompanied by the application of 0 V during sampling to render the P-type transistor 501 conductive, and the actual potential of the outputs S1 through SN of the driver 20 is picked up at the checkout signal output terminal D. The Vg-In characteristics of the transistors are determined based on the resulting potential of the driver output and the value of the drain current measured at the checkout signal output terminals B1 and B2. The variation of the mobility or the threshold value of the N-channel-type checkout transistor TN are determined based on the transistor characteristics thus obtained.

In the N-type transistors formed on a panel, the threshold voltage exhibits the same tendencies both for the driver 20 and for the checkout transistors. It is therefore possible to determine the threshold voltage of transistors in the driver 20 by employing the checkout circuit described above.

Figure 23:
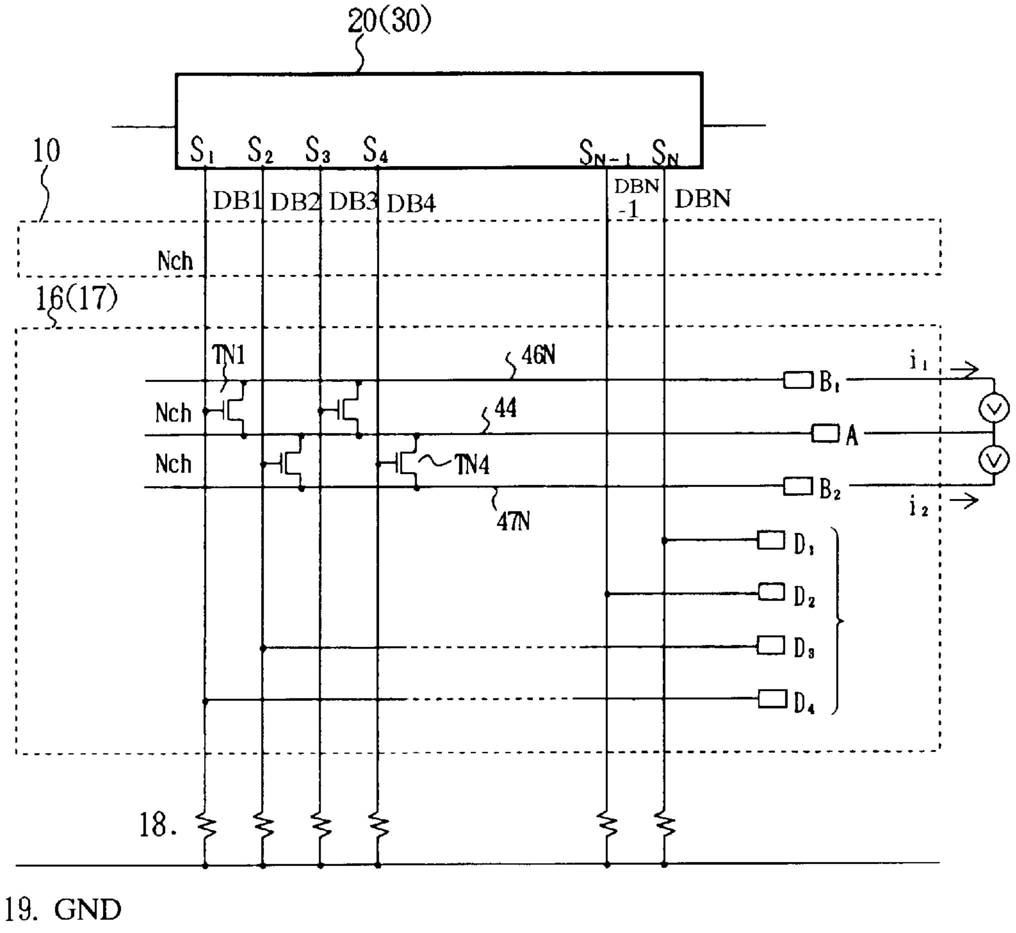
FIG. 23 is a diagram depicting the checkout circuit of the modification in FIG. 22.

FIG. 23 is a diagram depicting the checkout circuit of the modification in FIG. 22. This checkout circuit is provided with the checkout signal reference terminals D1 through D4 directly connected to buses DB1, DB2, DBN-1, and DBN in order to determine the output potential of the driver 20. The potential of the outputs S1, S2, SN-1, and Sn of the driver 20 can therefore be directly picked up at these terminals as representative outputs of the driver 20.

Figure 24:
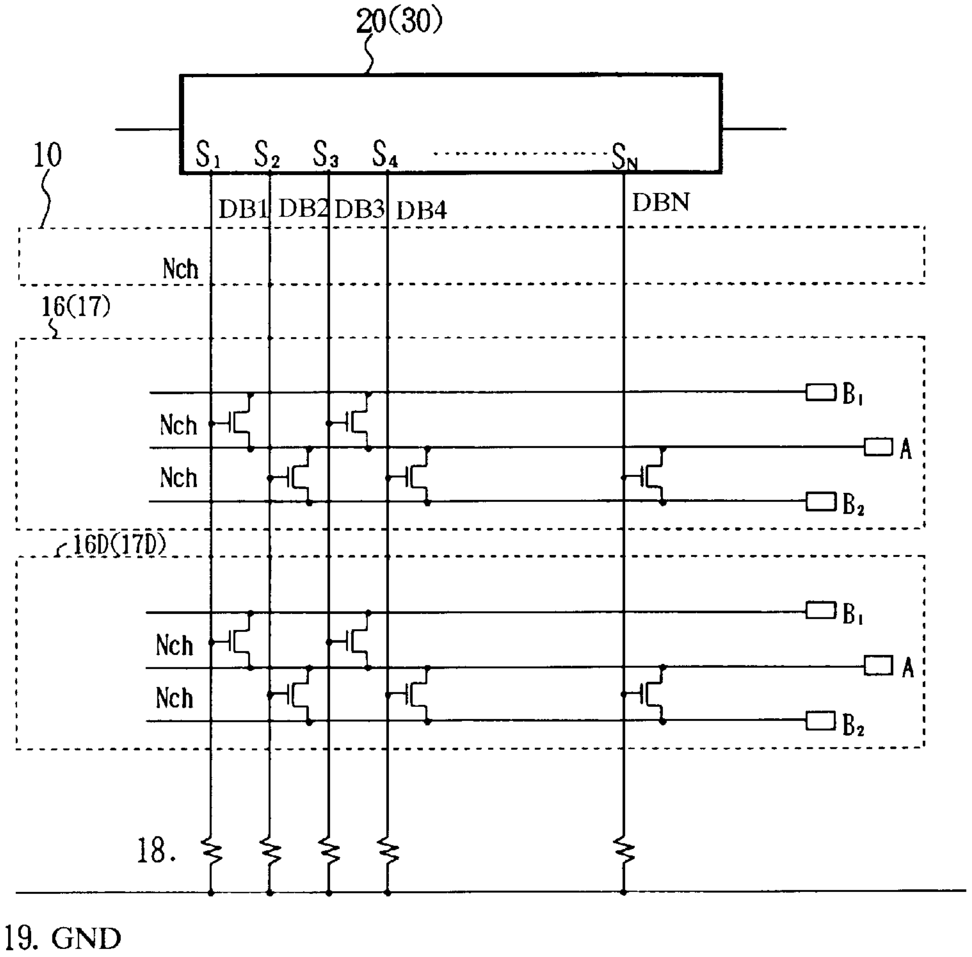
FIG. 24 is a diagram depicting another example of the checkout circuit.

FIG. 24 is a diagram depicting another example of the checkout circuit. This checkout circuit is provided with a redundancy check circuit 16D in addition to the checkout circuit 16 depicted in FIG. 15. Specifically, a defect on the side of a normal circuit, such as the driver 20, cannot be detected when a defect occurs in the checkout circuit 16, which is formed on the same panel. In such cases, therefore, detection is accomplished using the redundancy check circuit 16D. Consequently, it is preferable for the various checkout circuits described above to have redundancy and to contain backup checkout circuits.

Figure 25:
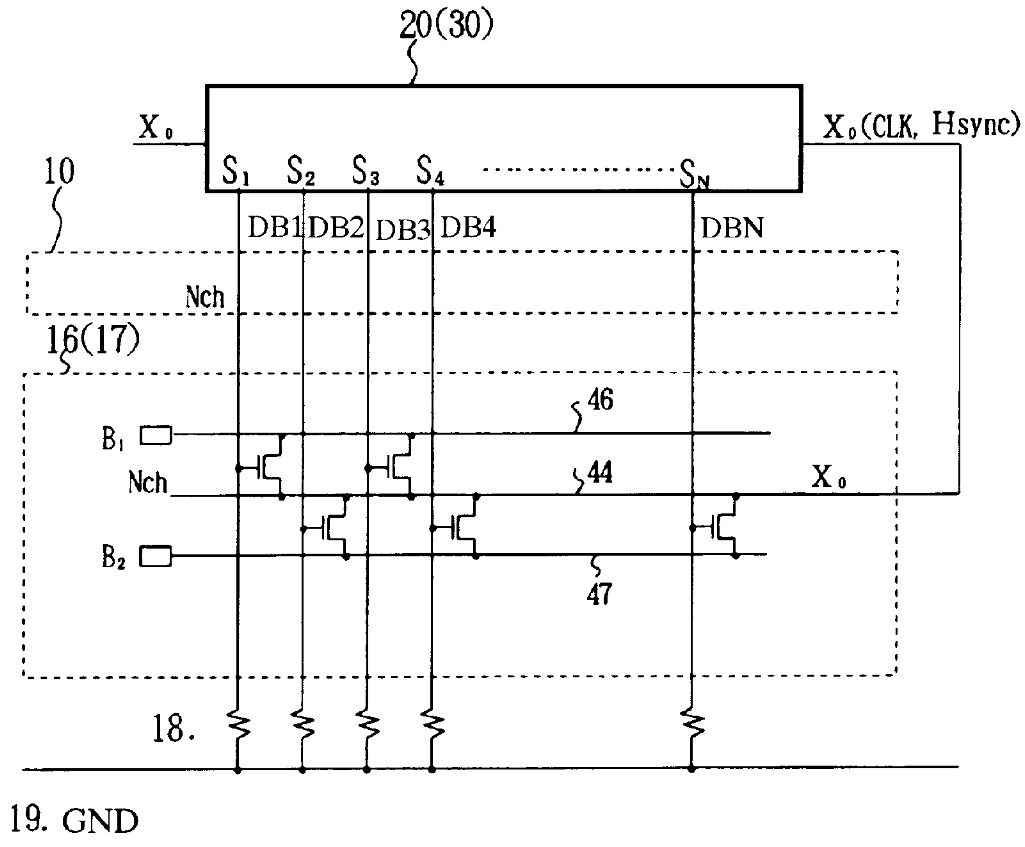
FIG. 25 is a diagram depicting yet another modified example of the checkout circuit.

FIG. 25 is a diagram depicting yet another modified example of the checkout circuit. The checkout circuit 16 pertaining to this example is the same as the checkout circuit in FIG. 5. The only difference is that the checkout signal input terminals are not provided and that the internal voltage produced inside the panel is applied to the input bus 44. Examples of such internal voltage include horizontal synchronous signals Hsync and clock signals CLK applied to the driver 20. Consequently, there is no need to apply checkout signals from the outside. For example, drive signals are applied to the outputs S1 through SN in synchronism with horizontal synchronous signals when the driver is a data driver. As a result, the checkout circuit operates normally when checkout signals of prescribed voltage are applied to the input bus 44 in synchronous with these drive signals.

Figure 26:
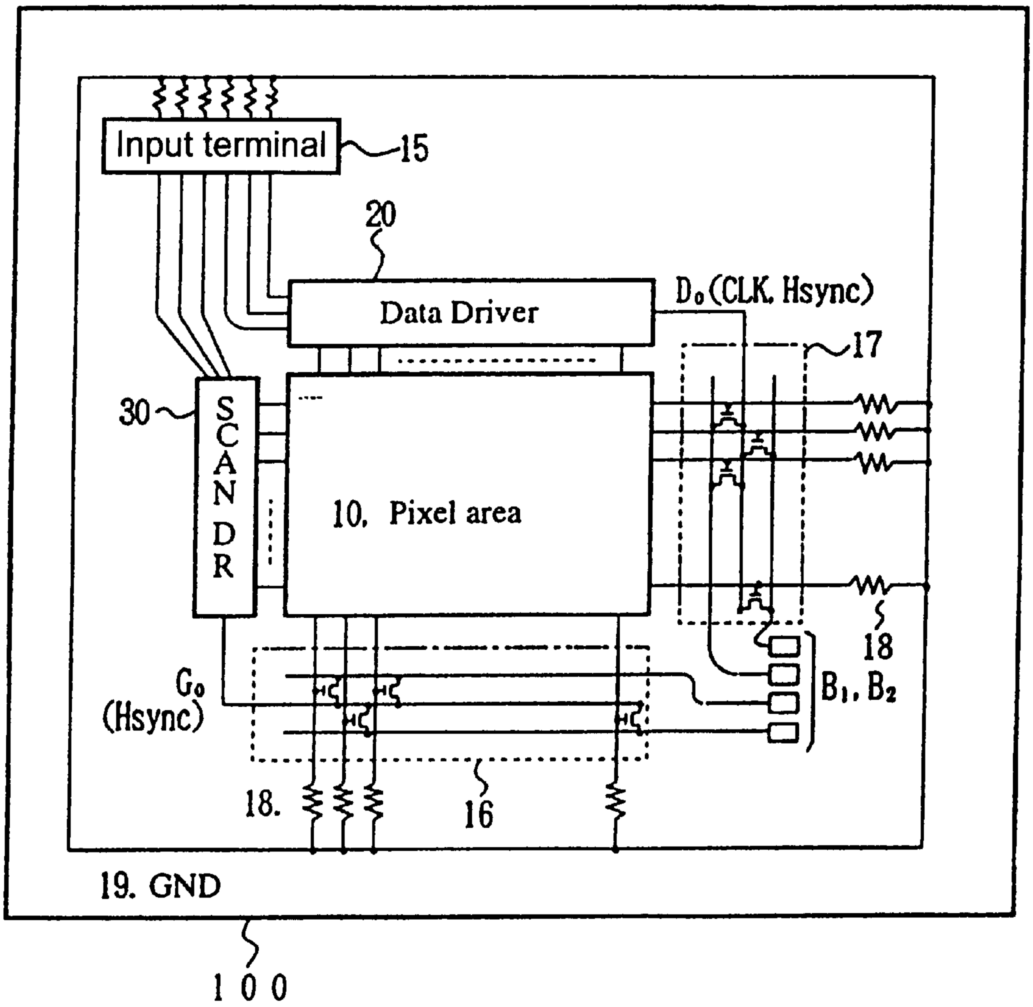
FIG. 26 is a block diagram of the entire panel featuring the checkout circuit in FIG. 25.

FIG. 26 is a block diagram of the entire panel featuring the checkout circuit in FIG. 25. Specifically, a signal from the data driver 20 is applied as the checkout signal $D_0$ to the checkout circuit 17 on the side of the scanning driver 30. In addition, an internal signal $G_0$ from the scanning driver 30 is applied as a checkout signal to the checkout circuit 16 on the side of the data driver 20. Consequently, the checkout circuits have only two outside terminals: checkout signal output terminals B1 and B2.

Checkout Circuit for Point-sequential Drive-type Data Driver

An example of a checkout circuit for a point-sequential drive-type data driver will now be described. The point-sequential data driver is as described with reference to FIG. 3. In this data driver, levels that correspond to video signals are applied in the form of a time series to data buses. Consequently, the checkout transistors of the checkout circuits provided for a line-sequential drive-type in which levels that correspond to video signals are applied to all the data buses at once can not be applied to the point-sequential drive-type data driver.

Figure 27:
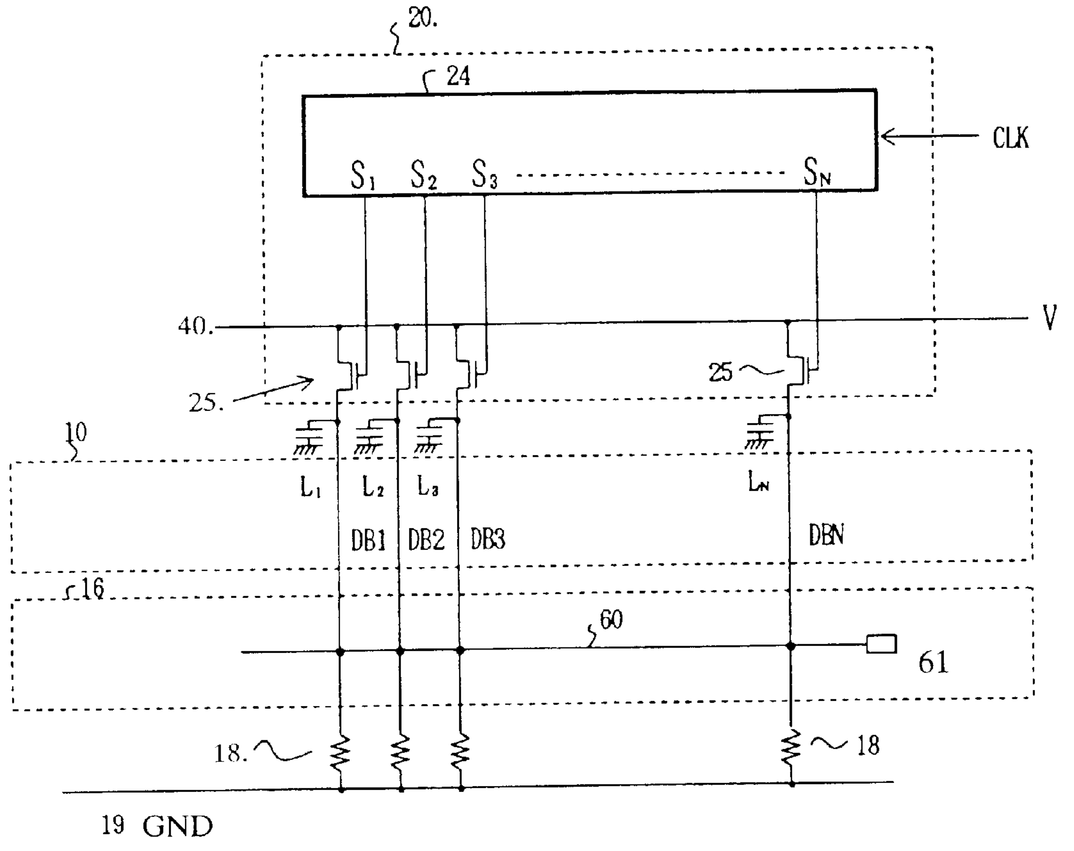
FIG. 27 is a diagram depicting an example of the checkout circuit of a point-sequential data driver as a fourth embodiment.

FIG. 27 depicts an example of the checkout circuit of a point-sequential data driver as a fourth embodiment. In this example, the data driver 20 is such that the outputs S1 through SN of the shift register 24 are connected to the gates of the analog switches 25 in the same manner as in FIG. 3. Video signals provided to a video signal line 40 are applied these sequentially to data buses DB1 through DBN in synchronous with clock CLK. In the drawing, L1 through LN denote the capacity of the data buses DB.

The checkout circuit 16 comprises a checkout bus 60 connected to all the data buses DB and a checkout terminal 61 connected to this bus. Because it is connected to all the data buses DB, the checkout bus 60 is disconnected from the panel once the inspection process has been completed.

Figure 28:
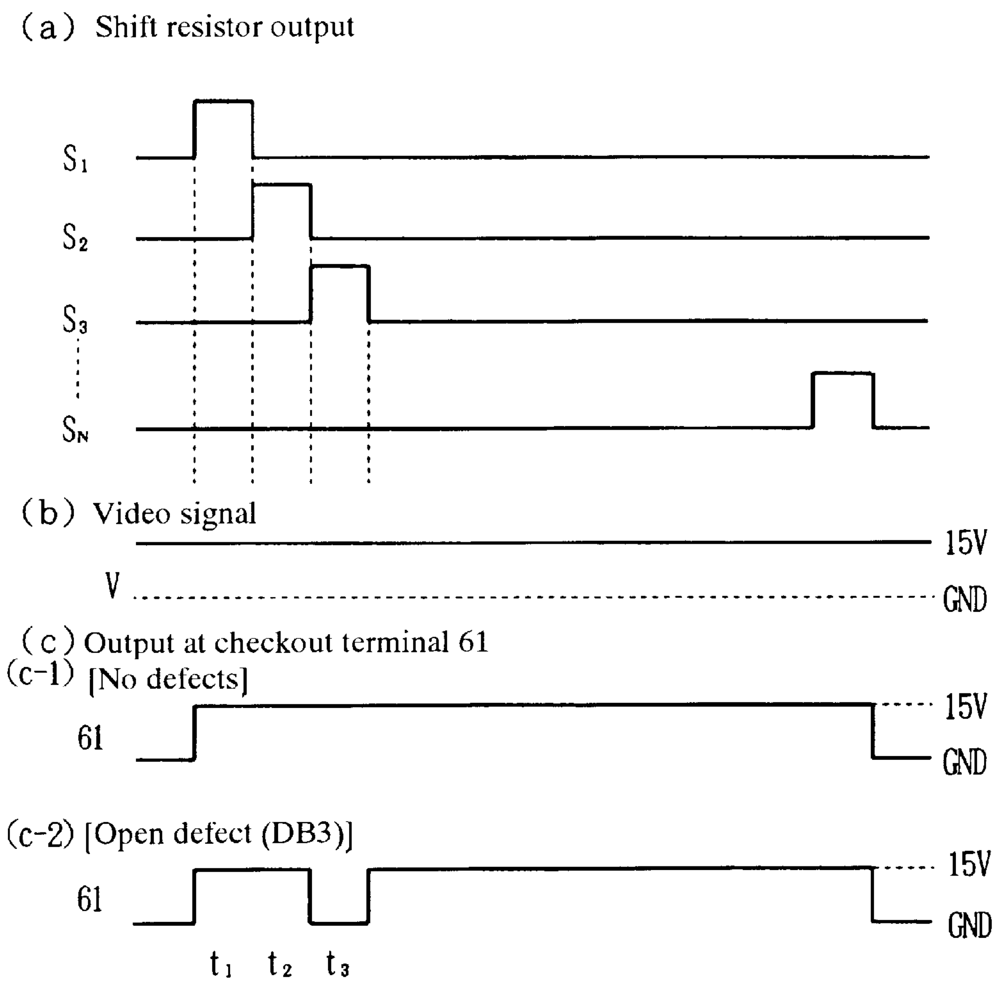
FIG. 28 is a timing chart depicting the operation of the checkout circuit in FIG. 27.

FIG. 28 is a timing chart depicting the operation of the checkout circuit in FIG. 27. H-level pulses are sequentially applied to the outputs S1 through SN of a shift register 24 in synchronism with clock CLK, as shown in (a) of FIG. 28. The analog switches 25 are sequentially rendered conductive by these pulse signals, and the video signals V applied to a video signal line 40 are sequentially applied to the data buses DB1 through DBN. Signals having a voltage of, for example, 15 V are applied as such video signals V. At this time, the presence of breaks (open circuits) in the data buses DB can be detected by monitoring the signals picked up at the checkout terminal 61.

In a normal state, the signal picked up at the checkout terminal 61 is the same 15-V signal as the video signal, as shown in (c-1) of FIG. 28. When a break has occurred in the data bus DB3, however, this data bus DB3 acquires ground potential via a terminal resistance 18, and the same L-level as that shown in (c-2) of FIG. 28 is observed at the checkout terminal 61 at time t3. In addition to the aforementioned break(open) in the data bus, faulty conduction of analog switches 25 may also result in the L-level.

Figure 29:
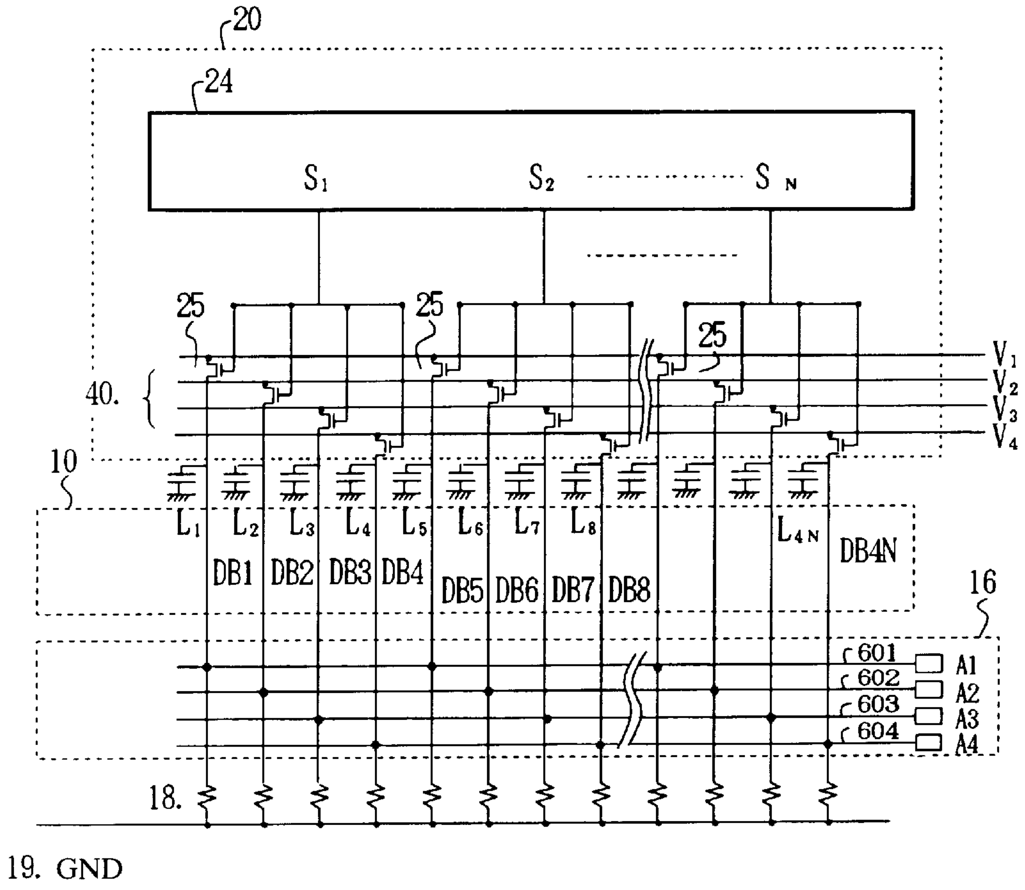
FIG. 29 is a diagram depicting an example of the checkout circuit of a point-sequential data driver.

FIG. 29 depicts another example of the checkout circuit of a point-sequential data driver. In a point-sequential data driver, serially applied video signals are sequentially transmitted to the data buses DB. However, a fixed time is needed to drive the load capacity of a data bus. It is therefore difficult to energize the load capacity within the period of the clocks CLK. In view of this, a plurality of video signal lines 40 are used, and a data driver circuit for the parallel energizing of data buses is adopted.

FIG. 29 depicts an example of such a data driver 20. Specifically, shift registers S1 through SN cause four analog switches 25 to conduct simultaneously. Four video signal lines 40 are also provided, and video signals V1, V2, V3, and V4 are simultaneously applied to data buses DB1 through DB4 by the shift register output S1. This arrangement makes it possible to prolong the drive period of the data buses.

The data driver 20 thus configured makes it possible to detect the presence of shorts in the data buses with the aid of the checkout circuit 16 in FIG. 29. In this checkout circuit 16, four checkout buses 601 through 604 are connected to the data buses DB at staggered intervals of four. These checkout buses 601 through 604 are also connected to checkout terminals A1 through A4.

Figure 30:
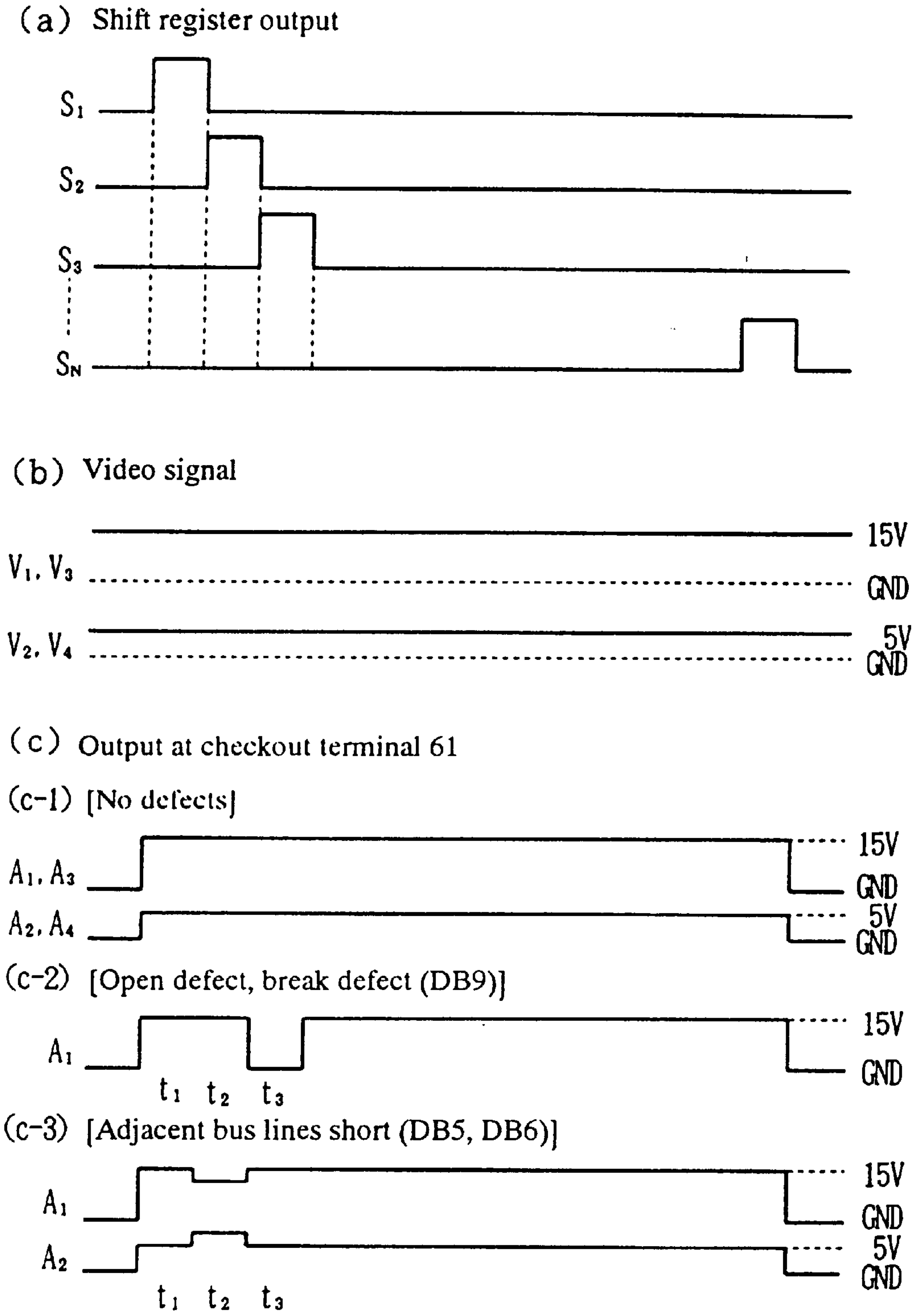
FIG. 30 is a timing chart illustrating the operation of the checkout circuit in FIG. 29.

FIG. 30 is a timing chart illustrating the operation of the checkout circuit in FIG. 29. A distinctive feature of this checkout circuit is that, as shown in (b) of FIG. 30, high voltage (for example, 15 V) is used for the video signals V1 and V3 for checkout purposes, and a lower voltage (for example, a voltage of 5 V) is used for the video signals V2 and V4. The high voltage of 15 V is thus applied to the odd-numbered data buses, and the low voltage of 5 V is applied to the even-numbered data buses. As a result, a potential that is intermediate between 15 V and 5 V is picked up at checkout terminals when a short has formed between adjacent data buses. In this example, a potential that is intermediate between 15 V and 5 V is picked up at the checkout terminals A1 and A2 at time t2, when the output S2 of the shift register 24 reaches the H-level. A short between the data buses DB5 and DB6 will therefore allow the intermediate potential corresponding to the voltage of the video signals applied thereto to be picked up at the checkout terminals A1 and A2, which are connected to the corresponding data buses.

Figure 31:
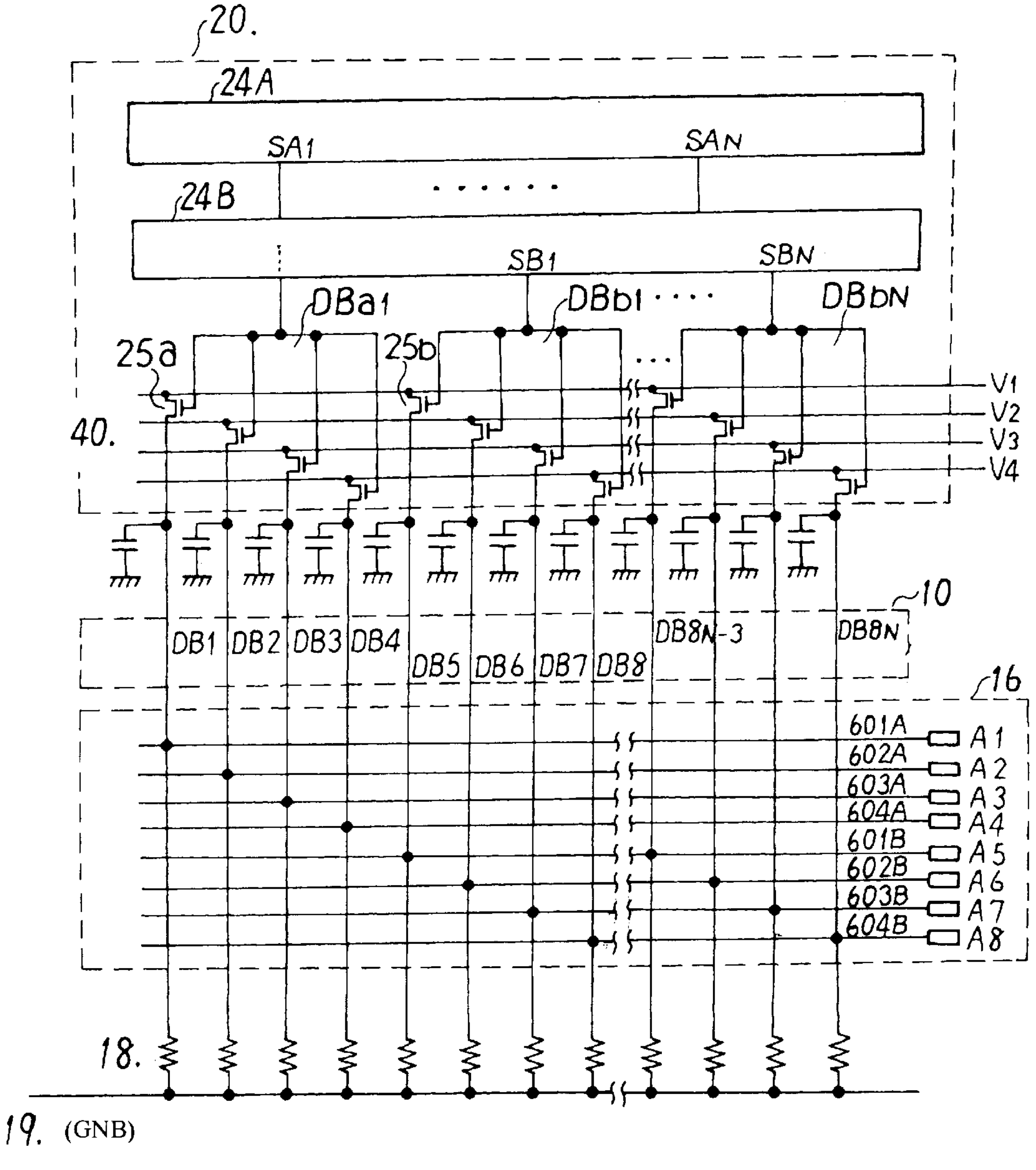
FIG. 31 is a diagram depicting a checkout circuit for yet another data driver 20.

A break (open circuit) in the data bus DB9 will allow the L-level to be picked up at the corresponding checkout terminal A1 at time t3, as shown in (c-2) of FIG. 30. FIG. 31 is a diagram depicting a checkout circuit for yet another data driver 20. In this data driver 20, the internal shift registers form two systems: 24A and 24B. This arrangement allows the speed of the shift registers to be reduced in half and makes it easier for the driver circuits formed on the glass substrate to be designed and manufactured.

Figure 32:
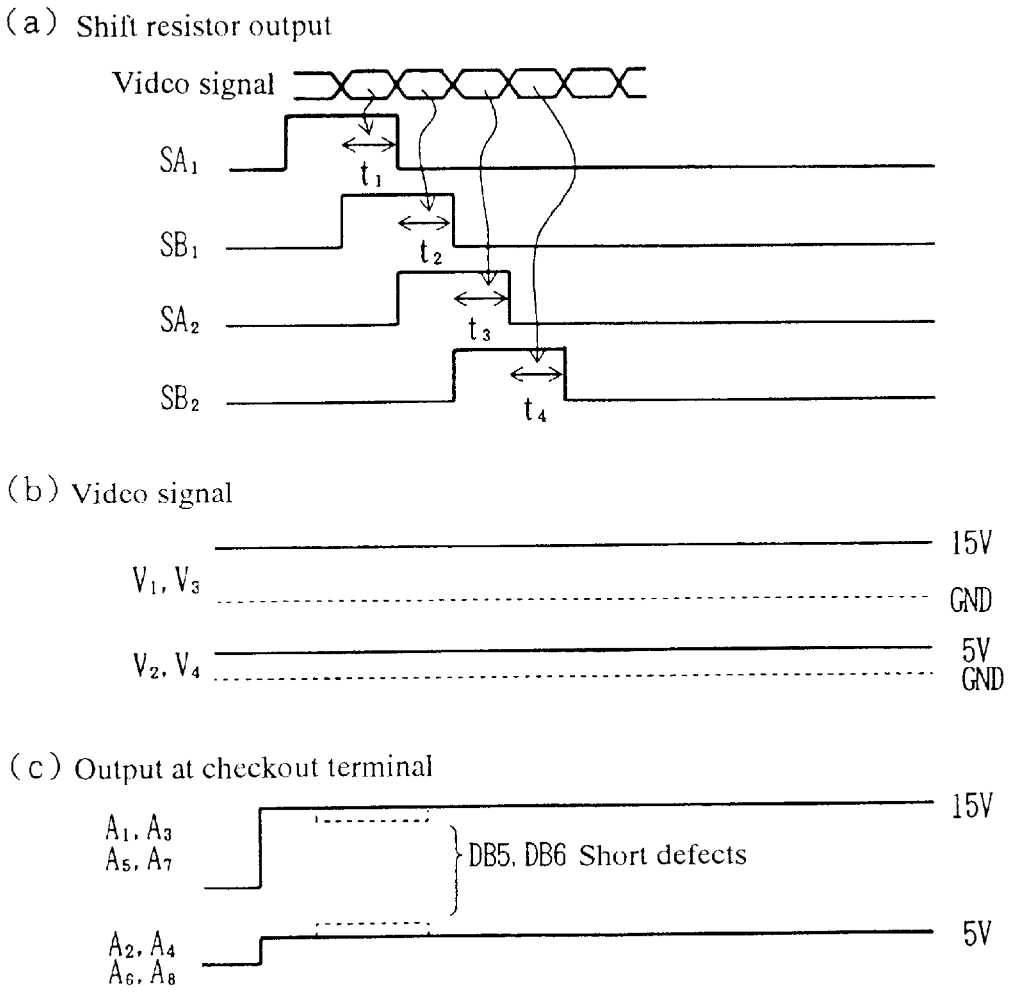
FIG. 32 is a timing chart illustrating the operation of the checkout circuit in FIG. 31.

FIG. 32 is a timing chart illustrating the operation of this checkout circuit. As shown in FIG. 32*a*, the waveforms of the outputs SA1 through SAN of the shift register 24A and the waveforms of the outputs SB1 through SBN of the shift register 24B overlap by a half pulse width for systems A and B. The video signals V1 through V4 are presented to the respective data buses DB during periods that correspond to the second half of each pulse's width. As shown in FIG. 32, the analog switches 25*a* and 25*b* become simultaneously conductive at time t1. During this period, video signals are applied to the data buses DB1 through DB4 and the data buses DB5 through DB8. As a result, the video data are written into the pixels of the data buses DB1 through DB4. The output SA1 of the shift register 24A subsequently drops to the L-level, the next video signal is presented, and this video signal is applied to the data buses DB5 through DB8 at time t2 to perform a write operation. In other words, the video data are constantly written into each pixel during the second half of the pulse outputted by the shift register.

Dividing the shift registers into two systems in such a way creates a period during which the analog switches 25*a* and 25*b* are in the conducting state at the same time. Consequently, the checkout circuit in this example has eight checkout buses: four in system A (601A through 604A) and four in system B (601B through 604B). As a result, there is no competition between the checkout signal outputs at the checkout terminals A1 through A8.

As shown in (b) of FIG. 32, signals having a certain voltage are presented during checkout. For example, 15 V is used for the video signals V1 and V3, and 5 V is used for the video signals V2 and V4. As a result, a potential that is intermediate between 15 V and 5 V is picked up at the checkout terminals A5 and A6 when a short has formed between the data buses DB5 and DB6, as shown in (c) of FIG. 32. The presence of a break in the data buses is detected in the same manner as in FIG. 30.

The presence of breaks or shorts in data buses can thus be detected with the aid of the above-described checkout circuit 16 when a point-sequential drive-type data driver is used.

Reverting again to FIG. 1, the circuits depicted in FIGS. 4 through 26 are used in the checkout circuit 17 designed for the scanning driver 30. Similarly, the circuits depicted in FIGS. 4 through 26 are used for the checkout circuit of the line-sequential drive-type data driver 20. Finally, the checkout circuits illustrated in FIGS. 27 through 32 are used for the checkout circuit of the point-sequential data driver 20.

As described above, the present invention allows drive malfunctions or the presence of breaks or shorts in data buses or scanning buses to be detected, using the functions of a driver composed of TFT circuits, in an active-matrix-type liquid-crystal display device obtained by integrating drivers and other peripheral circuits. In addition, few outside terminals are needed for checkout.

What is claimed is:

1. A liquid-crystal display device wherein a pixel area including a plurality of scanning buses, a plurality of data buses intersecting therewith and pixel transistors and pixel electrodes formed at the intersections therebetween; a scanning driver for energizing said scanning buses; and a data driver for presenting said data buses with data signals are formed on a substrate, said liquid-crystal display device further comprising:

a checkout circuit having a plurality of checkout transistors connected to the corresponding data buses or scanning buses; an input bus for applying prescribed checkout signals to said plurality of checkout transistors; and an output bus for picking up the signals from said plurality of checkout transistors, wherein said checkout transistors are such that their gates are connected to said data buses or scanning buses, and their sources or drains are connected to said input bus and output bus.

2. A liquid-crystal display device as defined in claim 1, wherein said checkout transistors comprise an N-type transistor array and a P-type transistor array; and said driver sequentially presents said data buses or scanning buses with positive and negative pulse signals for checkout purposes.

3. A liquid-crystal display device wherein a pixel area including a plurality of scanning buses, a plurality of data buses intersecting therewith and pixel transistors and pixel electrodes formed at the intersections therebetween; a scanning driver for energizing said scanning buses; and a data driver for presenting said data buses with data signals are formed on a substrate, said liquid-crystal display device further comprising:

a checkout circuit having a plurality of checkout transistors connected to the corresponding data buses or scanning buses; an input bus for applying prescribed checkout signals to said plurality of checkout transistors; and an output bus for picking up the signals from said plurality of checkout transistors, wherein said output bus comprises a first output bus and a second output bus;

the checkout transistors of said checkout circuit comprise first checkout transistors whose gates are connected to the odd-numbered data buses or scanning buses and whose sources or drains are connected to said input bus and first output bus, and second checkout transistors whose gates are connected to the even-numbered data buses or scanning buses and whose sources or drains are connected to said input bus or second output bus; and pulse signals used for checkout purposes are sequentially presented by said driver to said data buses or scanning buses, and said checkout signals are picked up at said first or second output bus in accordance with the conducting state of said first and second checkout transistors.

4. A liquid-crystal display device as defined in claim 3, wherein said checkout circuit comprises a first checkout circuit provided with N-type checkout transistors and a second checkout circuit provided with P-type checkout transistors; and said driver sequentially presents said data buses or scanning buses with positive and negative pulse signals for checkout purposes.

5. A liquid-crystal display device wherein a pixel area including a plurality of scanning buses, a plurality of data buses intersecting therewith and pixel transistors and pixel electrodes formed at the intersections therebetween; a scanning driver for energizing said scanning buses; and a data driver for presenting said data buses with data signals are formed on a substrate, said liquid-crystal display device further comprising:

a checkout circuit having a plurality of checkout transistors connected to the corresponding data buses or scanning buses; an input bus for applying prescribed checkout signals to said plurality of checkout transistors; and an output bus for picking up the signals from said plurality of checkout transistors, wherein said checkout transistors are such that their gates are connected to said input bus, and their sources or drains are connected to said data buses or scanning buses and to said output bus.

6. A liquid-crystal display device as defined in claim 5, wherein said checkout transistors comprise an N-type transistor array and a P-type transistor array; and said driver sequentially presents said data buses or scanning buses with positive and negative pulse signals for checkout purposes.

7. A liquid-crystal display device wherein a pixel area including a plurality of scanning buses, a plurality of data buses intersecting therewith and pixel transistors and pixel electrodes formed at the intersections therebetween; a scanning driver for energizing said scanning buses; and a data driver for presenting said data buses with data signals are formed on a substrate, said liquid-crystal display device further comprising:

a checkout circuit having a plurality of checkout transistors connected to the corresponding data buses or scanning buses; an input bus for applying prescribed checkout signals to said plurality of checkout transistors; and an output bus for picking up the signals from said plurality of checkout transistors, wherein said output bus comprises a first output bus and a second output bus;

the checkout transistors of said checkout circuit comprise first checkout transistors whose gates are connected to said input bus and whose sources or drains are connected to the odd-numbered data buses or the scanning buses and to the first output bus, and second checkout transistors whose gates are connected to said input bus and whose sources or drains are connected to the even-numbered data buses or scanning buses and to the second output bus; and pulse signals used for checkout purposes are sequentially presented by said driver to said data buses or scanning buses, and said checkout pulse signals are picked up at said first or second output bus in accordance with the conducting state of said first and second checkout transistors.

8. A liquid-crystal display device as defined in claim 7, wherein said checkout circuit comprises a first checkout circuit provided with N-type checkout transistors and a second checkout circuit provided with P-type checkout transistors; and said driver sequentially presents said data buses or scanning buses with positive and negative pulse signals for checkout purposes.

9. A liquid-crystal display device wherein a pixel area including a plurality of scanning buses, a plurality of data buses intersecting therewith and pixel transistors and pixel electrodes formed at the intersections therebetween; a scanning driver for energizing said scanning buses; and a data driver for presenting said data buses with data signals are formed on a substrate, said liquid-crystal display device further comprising:

a checkout circuit having a plurality of checkout transistors connected to the corresponding data buses or scanning buses; an input bus for applying prescribed checkout signals to said plurality of checkout transistors; and an output bus for picking up the signals from said plurality of checkout transistors, wherein said checkout transistors comprise a first checkout transistor array in which the gates are connected to said data buses or scanning buses and in which the sources or drains are connected to said input bus and output bus, and a second transistor array in which the gates are connected to said input bus and in which the sources or drains are connected to said data buses or scanning buses and to the output bus.

10. A liquid-crystal display device as defined in any one of claims 1 through 9, wherein said data buses or scanning buses connected to said checkout circuit are connected to a common terminal wiring via a terminal resistance.

11. A liquid-crystal display device as defined in any one of claims 1 through 9, wherein the input bus of said checkout circuit is presented with said checkout signals from said data driver or scanning driver.

12. A liquid-crystal display device as defined in any one of claims 1 through 9, wherein said checkout circuit is characterized by the overlapping of a regular checkout circuit and a redundancy check circuit.

* * * * *

UNITED STATES PATENT AND TRADEMARK OFFICE
CERTIFICATE OF CORRECTION

PATENT NO. : 6,064,222
DATED : May 16, 2000
INVENTOR(S) : Morita et al.

It is certified that error appears in the above-identified patent and that said Letters Patent is hereby corrected as shown below:

Title page,
Item [57] ABSTRACT,
Line 12, after "transistors" insert -- are also included in the liquid -- crystal display device --

Signed and Sealed this

Twenty-ninth Day of January, 2002

*Attest:*

JAMES E. ROGAN
*Director of the United States Patent and Trademark Office*

*Attesting Officer*